(12) United States Patent
Sakayori et al.

(10) Patent No.: US 8,252,423 B2
(45) Date of Patent: Aug. 28, 2012

(54) LAMINATE AND USE THEREOF

(75) Inventors: Katsuya Sakayori, Shinjuku-ku (JP);
Shigeki Kawano, Shinjuku-ku (JP);
Hiroko Amasaki, Shinjuku-ku (JP);
Hidetsugu Tazawa, Shinjuku-ku (JP);
Kazunari Ikeda, Shinjuku-ku (JP);
Kouhei Ohno, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 12/911,263

(22) Filed: Oct. 25, 2010

(65) Prior Publication Data

US 2011/0076855 A1    Mar. 31, 2011

Related U.S. Application Data

(62) Division of application No. 10/069,047, filed as application No. PCT/JP01/05319 on Jun. 21, 2001, now abandoned.

(30) Foreign Application Priority Data

Jun. 21, 2000 (JP) ................................. 2000-186564
Jul. 31, 2000 (JP) ................................. 2000-232227
Feb. 6, 2001 (JP) ................................. 2001-030171
Feb. 6, 2001 (JP) ................................. 2001-030249

(51) Int. Cl.
*B32B 27/00* (2006.01)
*B32B 27/06* (2006.01)

(52) U.S. Cl. ............... 428/473.5; 156/330.9; 216/13; 438/106

(58) Field of Classification Search ........... 428/473.5; 156/330.9; 216/13; 438/106
See application file for complete search history.

(56) References Cited

U.S. PATENT DOCUMENTS

| 5,362,550 A | 11/1994 | Takeshita |
| 5,621,068 A | 4/1997 | Okamoto et al. |
| 5,668,247 A | 9/1997 | Furutani et al. |
| 6,203,918 B1 | 3/2001 | Shimose et al. |

FOREIGN PATENT DOCUMENTS

| EP | 0 832 918 A1 | 1/1998 |
| JP | A 52-108496 | 9/1977 |
| JP | A-03-014294 | 1/1991 |
| JP | A 5-214101 | 8/1993 |
| JP | A-5-235491 | 9/1993 |
| JP | A-06-234959 | 8/1994 |
| JP | A 9-169088 | 6/1997 |
| JP | A 63-84117 | 4/1998 |
| JP | A 11-204636 | 7/1999 |
| JP | A 2000-123512 | 4/2000 |
| WO | WO 98/08216 | 2/1998 |

OTHER PUBLICATIONS

Hawley's Condensed Chemical Dictionary, 13th Ed., Richard Lewis, Sr., ed., John Wiley & Sons, New Yord: 1997, pp. 33, 585, 586.

*Primary Examiner* — Terressa Boykin
(74) *Attorney, Agent, or Firm* — Oliff & Berridge, PLC

(57) ABSTRACT

There is provided a resin laminate having a layer construction of a first inorganic material layer/insulating layer/second inorganic material layer or a layer construction of an inorganic material layer/insulating layer, wherein the insulating layer has a multi-layer structure of two or more resin layers of a core insulating layer and an adhesive insulating layer. In this case, the resin laminate has the adhesive insulating layer which can realize optimal etching, is suitable for etching by a wet process, and has excellent adhesion. At least one of the layers constituting the insulating layer is formed of a polyimide resin which comprises repeating units represented by formula (1) and has a glass transition point of 150 to 360° C. and is dissolvable in a basic solution at a rate of more than 3 μm/min, preferably more than 5 μm/min, and most preferably more than 8 μm/min.

1 Claim, 13 Drawing Sheets

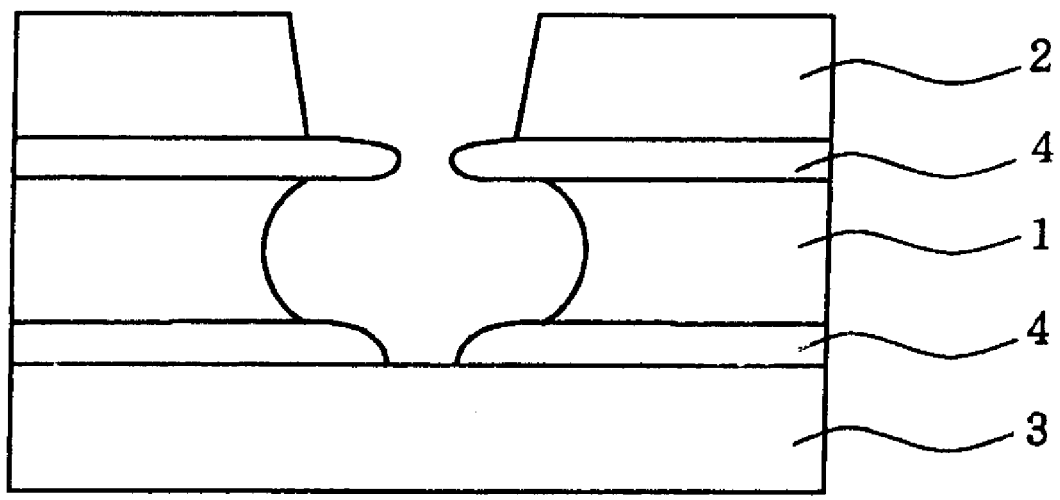
F I G. 1

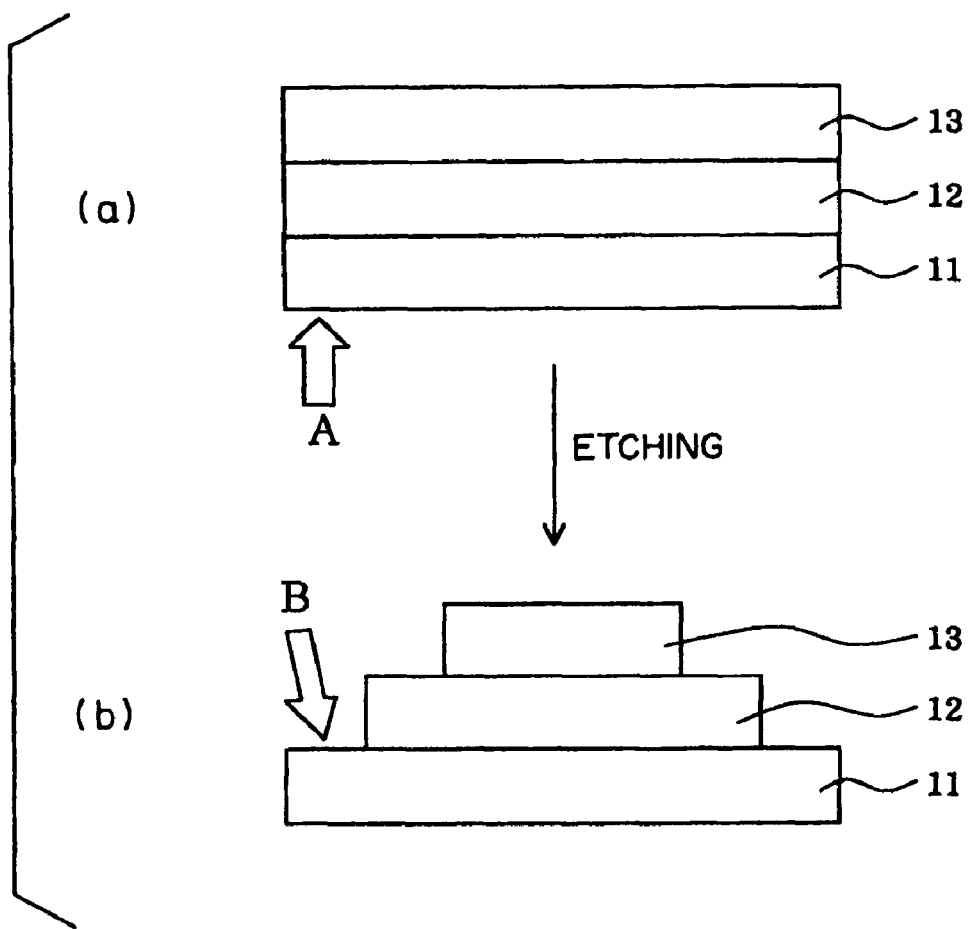
F I G. 3

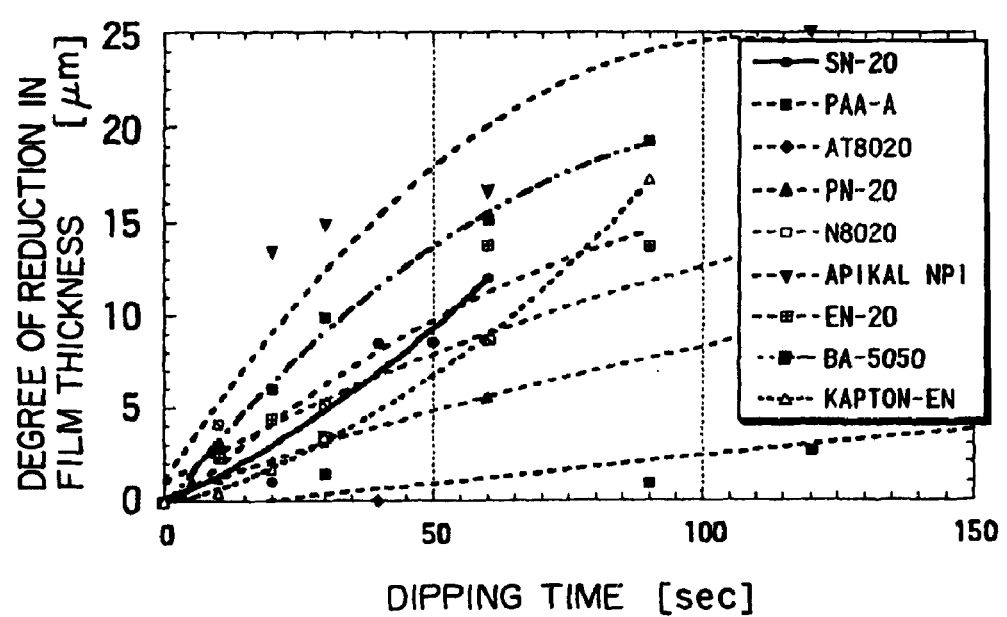
F I G. 4

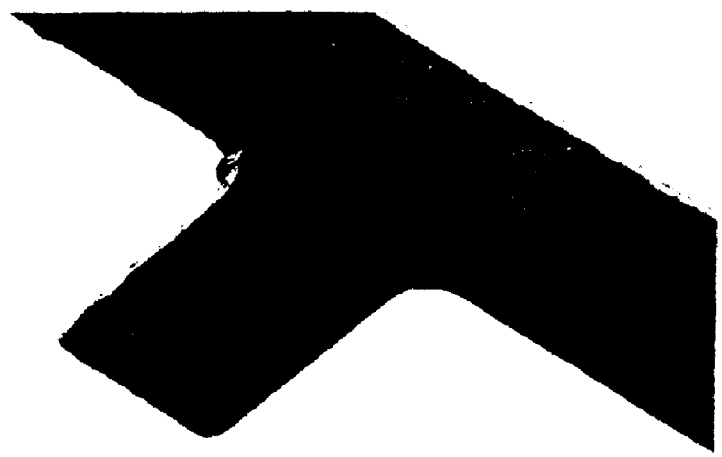
F I G. 5
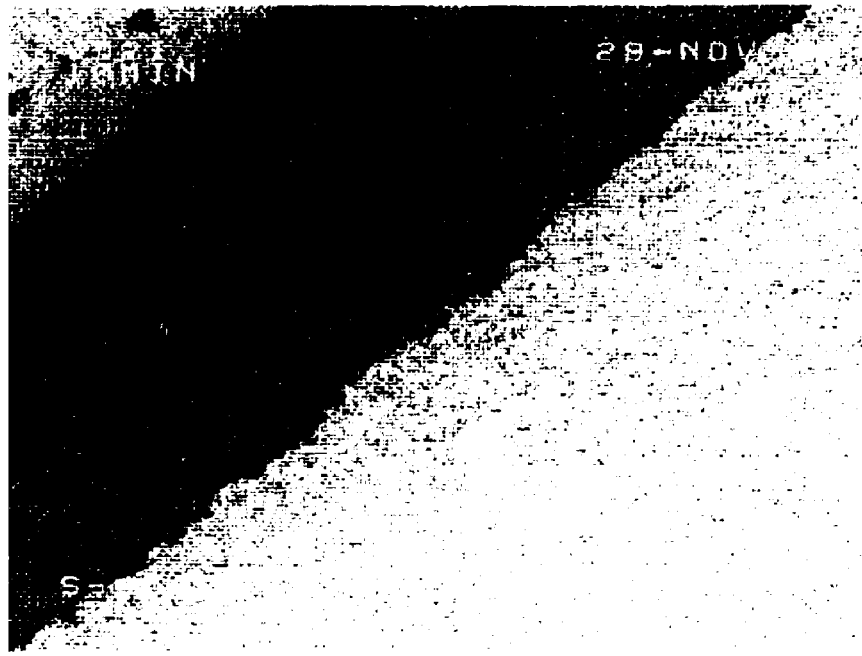
F I G. 6

LAMINATE AND USE THEREOF

This is a Division of application Ser. No. 10/069,047 filed Feb. 21, 2002, now abandoned which in turn is a U.S. national stage application of PCT/JP01/05319, filed Jun. 21, 2001. The disclosure of each of the prior applications is hereby incorporated by reference herein in its entirety.

TECHNICAL FIELD

The present invention relates to a laminate suitable for etching, by wet process, of a plurality of resin layers constituting an insulating layer in a laminate having a layer construction of first inorganic material layer (mainly metal layer)/insulating layer/second inorganic material layer (mainly metal layer) or a layer construction of inorganic material layer (mainly metal layer)/insulating layer, an insulating film, and an electronic circuit component, particularly a suspension for hard disk drives, produced by etching of the laminate by the wet process.

BACKGROUND ART

In recent years, rapid development of semiconductor technology has led to rapid progress of a reduction in size of semiconductor packages, the adoption of multipin, the adoption of fine pitch, minimization of electronic components and the like. That is, the semiconductor field has entered the so-called "age of high density packaging." Regarding printed wiring boards, this has also led to a change from single side wiring to double side wiring and, in addition, the adoption of a multilayer structure and a thickness reduction (Iwata and Harazono, "Denshi Zairyo (Electronic Material)," 35 (10), 53 (1996)).

Pattern formation methods used in the formation of such wiring and circuits include: a method which comprises the steps of etching a metal layer, provided on a substrate having a layer construction of metal layer/insulating layer/metal layer, with an acidic solution, such as a ferric chloride solution, to form wirings, and, in order to provide layer-to-layer continuity, then subjecting the insulating layer in a dry state to dry etching, such as plasma etching or laser etching, or wet etching, for example, with hydrazine to remove the insulating layer to form a desired shape (Japanese Patent-Laid Open No. 164084/1994), and connecting the wirings to each other, for example, through plating or electrically conductive paste; and a method (Proceedings of the 7th Symposium of Japan Institute of Electronics Packaging, 1999) which comprises the steps of providing an insulating layer in a desired form using a photosensitive polyimide (Japanese Patent Laid-Open No. 168441/1992) or the like and then plating gaps to form wiring.

A tendency toward downsizing of electric products in recent years has led to a reduction in thickness of each layer constituting metal layer/polymeric insulating layer, and these layers each are in many cases used in a thickness of not more than 100 μm. When wiring has been formed of such thin layer, a warpage disadvantageously takes place in wiring due to a difference in coefficient of thermal expansion between the metal layer and the polymeric insulating layer.

When the thermal properties of the insulating layer and the conductor layer are known, the warpage a of this substrate can be calculated according to the following equation (Miyaaki and Miki, NITTO TECHNICAL REPORT, 35 (3), 1 (1997)).

$$\sigma = \frac{3 l E_1 E_2}{2h(E_1^2 + 14 E_1 E_2^2 + E_2^2)} \Delta\alpha \Delta T$$

wherein
E1: modulus of the metal,
E2: modulus of the insulating layer,
Δα: difference in coefficient of thermal expansion between the metal and the insulating layer,
ΔT: temperature difference, and
h: layer thickness 1: wiring length.

According to this equation, the following two methods are considered effective for reducing the warpage of wiring:
1. a method wherein the modulus of the insulating layer is reduced; and
2. a method wherein the difference in coefficient of thermal expansion between the insulating layer and the metal wiring layer is reduced.

Regarding the wiring formation method, in the laminate used in the method for the formation of wiring through etching of a metal layer in the laminate having layer construction of first metal layer/insulating layer/second metal layer, in order to reduce the warpage of the laminate, the coefficient of thermal expansion of the metal layer should be made identical to the coefficient of thermal expansion of the insulating layer. To this end, the use of a low expansion polyimide as the insulating layer in the laminate has been proposed (U.S. Pat. No. 4,543,295 and Japanese Patent Laid-Open Nos. 18426/1980 and 25267/1977).

Since, however, the low-expansion polyimide is not generally thermoplastic, the adhesion to the metal layers is poor making it difficult to provide adhesive strength high enough to withstand practical use. It is known that, in order to overcome this problem, a thermoplastic polyimide resin or epoxy resin having good adhesion to the metal layers is used as an adhesive layer between the metal layer and the insulating layer (core layer) of the low-expansion polyimide (Japanese Patent Laid-Open No. 58428/1995).

In this case, the thickness of the low expansion core insulating layer is made larger than the thickness of the adhesive layer to avoid the appearance of warpage in the whole laminate. The thinner the adhesive layer, the better the effect of preventing warpage. Excessively small thickness of the adhesive layer, however, is detrimental to the adhesion. Further, at least when the total thickness of the upper and lower adhesive layers provided respectively on the upper side and the lower side of the core insulating layer is not more than the half of the thickness of the core insulating layer, the warpage is less likely to occur. For this reason, for commercially available laminates, the total thickness of the adhesive layers is in many cases not more than the half of the thickness of the core insulating layer (Japanese Patent Laid-Open No. 245587/1989).

In etching these materials by the wet process, however, when the two materials are different from each other in etching rate, in general, the edge shape is not straight and, in this case, the material having a lower etching rate is left. When the etching rate of the adhesive layer is lower than the etching rate of the core insulating layer, the edges of the upper and lower adhesive layers, which have sandwiched the core insulating layer therebetween, are projected. On the other hand, when the etching rate relationship is opposed to the above case, the adhesive layers are etched earlier than the core insulating layer and, in this case, the etched center is projected. The above problem makes it very difficult to perform patterning of the insulating layer by wet etching. Therefore, the insulating layer is generally patterned by the dry process using plasma or laser.

At the present time, rapid expansion of production of personal computers has also lead to increased production of hard disk drives incorporated in the personal computers. A component, in the hard disk drive, called a "suspension," which supports a head for reading magnetism, is being shifted in its main products from one, wherein copper wiring is connected to a stainless steel plate spring, to one called a "wireless suspension" comprising copper wiring which has been connected directly to a stainless steel plate spring, from the viewpoint of coping with the size reduction.

The wireless suspension is mainly formed of a laminate of first metal layer/adhesive insulating layer/core insulating layer/adhesive insulating layer/second metal layer. An example of the laminate comprises a first metal layer of a copper alloy foil, a second metal layer of a stainless steel foil, and an insulating layer composed of a core insulating layer and an adhesive insulating layer stacked on both sides of the core insulating layer. In the wireless suspension using the laminate, since scanning on a disk being rotated at a high speed is carried out, fine vibration is applied to the member. Therefore, the adhesive strength of the wiring is very important. For this reason, satisfying severe specifications is required of wireless suspensions using the laminate.

For components called the wireless suspension, there are two production methods, that is, an additive method wherein wirings are mainly formed through plating, and a subtractive method wherein a copper foil is etched to form wirings. In the case of the subtractive method, for the above reason, plasma etching is used for patterning a polyimide as the insulating layer.

The laminate as the material before etching for wireless suspensions has hitherto been etched only by the dry process. In the dry process, in general, etching is carried out for sheet by sheet (sheet method). Therefore, disadvantageously, the productivity is low, and, in addition, sine the apparatus is expensive, the production cost is very high. On the other hand, in the wet process, a continuous product can be continuously etched. Therefore, advantageously, the productivity is high, and, in addition, the apparatus cost is low. Regarding laminates for wireless suspensions required to satisfy severe specifications, however, the wet process could not have been put to practical use for the following reason.

As compared with etching by the dry process, in the case of etching by the wet process, materials to be etched are in many cases greatly different from each other in etching rate. For example, as described above, the adhesive used as a part of the insulating layer in the laminate for wireless suspension is mainly formed of a polyimide resin from the viewpoint of the necessity of ensuring a high level of insulation reliability. As described above, imparting thermoplasticity is a general method for imparting adhesion to the polyimide resin. The introduction of a flexible structure, which can impart thermoplasticity, into the skeleton of the polyimide resin, however, leads to a tendency such that the chemical resistance is increased. Therefore, this resin is likely to be poor in suitability for etching by the wet process, and, thus, the etching rate is much lower than the etching rate of the core insulating layer. As used herein, the term "etching rate" refers to the degree of a reduction in film thickness per unit time caused by etching.

In an insulating layer formed by providing a low expansion polyimide as a core insulating layer, providing an adhesive polyimide as an adhesive insulating layer, and combining and stacking these layers on top of each other or one another to form an insulating layer formed of a plurality of layers (for example, adhesive insulating layer/core insulating layer/adhesive insulating layer or adhesive insulating layer/core insulating layer), when this insulating layer is etched by the wet process, the etchability of the adhesive insulating layer is likely to be poor because the chemical resistance of the adhesive insulating layer is likely to be high, while the core insulating layer is easily etched. Therefore, the etching of the whole insulating layer does not proceed evenly, and, thus, even etching shape cannot be disadvantageously provided.

Thus, optimizing the etching rate of the core insulating layer and the etching rate of the adhesive insulating layer in the insulating layer in the laminate for electronic circuit components, such as wireless suspensions, and, at the same time, improving the adhesion of the adhesive layer are contradictory to each other and are difficult to simultaneously realize. However, both the above requirements should be simultaneously satisfied.

FIG. 1 is a conceptual cross-sectional view showing the etching shape of a laminate wherein a laminate for a wireless suspension, having a layer construction of first metal layer/adhesive insulating layer/core insulating layer/adhesive insulating layer/second metal layer, which has hitherto been etched only by the dry process, has been etched by the wet process from the first metal layer side. In FIG. 1, numeral 1 designates a core insulating layer formed of a low expansion polyimide resin. A first metal layer 2 is provided on one side of the core insulating layer 1 through an adhesive insulting layer 4. A second metal layer 3 is provided on the other side of the core insulating layer 1 through the adhesive insulating layer 4. As shown in FIG. 1, in the wet process, since, the etching rate of the adhesive insulating layer 4 is lower than that of the core insulating layer 1, the adhesive insulating layer 4 in its portion remaining unetched is left in the form of the eaves of a roof. Therefore, in the whole insulating layer, the etching shape is uneven.

Up to now, any polyimide resin, used for an adhesive insulating layer in a laminate for a wireless suspension having the above layer construction, which is suitable for etching by the wet process and has excellent adhesion, is not known.

DISCLOSURE OF THE INVENTION

Accordingly, it is an object of the present invention is to provide a laminate having a layer construction of first inorganic material layer (mainly metal layer)/insulating layer/second inorganic material layer (mainly metal layer) or a layer construction of inorganic material layer (mainly metal layer)/insulating layer, the insulating layer having a multilayer structure of two or more resin layers of a core insulating layer and an adhesive insulating layer, wherein the laminate has the adhesive insulating layer, which can realize optimal etching, and has a polyimide resin which is suitable for etching by the wet process and has excellent adhesion, to provide an insulating film for the formation of the laminate, and to provide an electronic circuit component using the same.

First Invention

The present inventors have made extensive and intensive studies on various polyimide resins which, when a multilayer structure of two or more resin layers is adopted in an insulating layer in a laminate having a layer construction of first inorganic material layer (mainly metal layer)/insulating layer/second inorganic material layer (mainly metal layer) or a layer construction of inorganic material layer (mainly metal layer)/insulating layer, can provide a good etching shape as a resin for the insulating layer.

As a result, it has been found that, also in a thermoplastic polyimide resin having good adhesion, the presence of a specific structure within the resin skeleton can accelerate the etching rate. According to this thermoplastic polyimide resin, the etching rate can be made close to the etching rate of the low expansion polyimide which structurally has a high etching rate, and a good etching shape can be provided even in etching by the wet process.

Thus, the laminate according to the present invention has a layer construction of first inorganic material layer/insulating layer/second inorganic material layer or a layer construction of inorganic material layer/insulating layer, said insulating layer having a multi-layer structure of two or more resin layers, at least one of the layers constituting the insulating layer being formed of a polyimide resin which comprises repeating units represented by formula (1) and has a glass transition point of 150 to 360° C. and is dissolvable in a basic solution at a rate of more than 3 μm/min, preferably more than 5 μm/min, most preferably more than 8 μm/min:

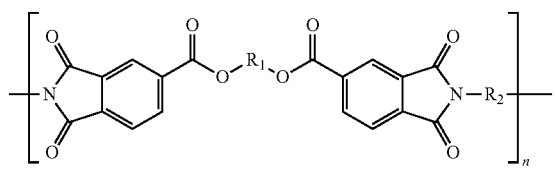

(1)

wherein $R_1$ and $R_2$ each represent a divalent organic group and may have a single structure or a combination of two or more structures; and n is an integer of two or more.

Another laminate according to the present invention has a layer construction of first inorganic material layer/insulating layer/second inorganic material layer or a layer construction of inorganic material layer/insulating layer, said insulating layer having a multi-layer structure of two or more resin layers, at least one layer constituting the insulating layer being formed of a polyimide resin which comprises repeating units represented by formula (2) and has a glass transition point of 150 to 360° C. and is dissolvable in a basic solution at a rate of more than 3 μm/min, preferably more than 5 μm/min, most preferably more than 8 μm/min:

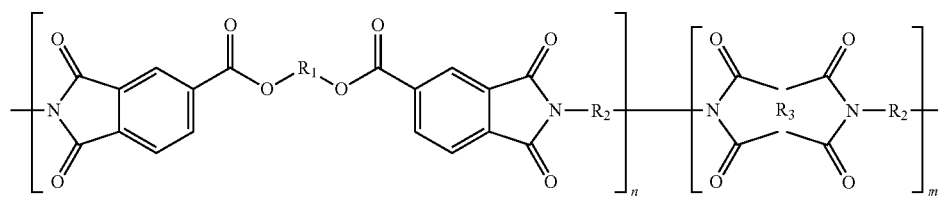

(2)

wherein $R_1$ and $R_2$ each represent a divalent organic group and may have a single structure or a combination of two or more structures; $R_1$ represents at least one acid dianhydride selected from the group consisting of diphenylsulfone-2,3,3',4'-tetracarboxylic acid dianhydride, diphenylsulfone-2,2',3,3'-tetracarboxylic acid dianhydride, pyromellitic acid dianhydride, benzophenonetetracarboxylic acid dianhydride, 2,3,3',4'-biphenyltetracarboxylic acid dianhydride, 3,3',4,4'-biphenyltetracarboxylic acid dianhydride, 2,3,3',4'-diphenyl ether tetracarboxylic acid dianhydride, 2,3,3',4,4'-diphenyl ether tetracarboxylic acid dianhydride, and 1,4,5,8-naphthalenetetracarboxylic acid dianhydride; and n and m are an integer of two or more.

In this case, conditions for determining the dissolution rate are preferably such that the dissolution rate is the highest in the etching liquid used. In the working examples of the present invention, 70° C. in a dip method (compose of only dipping in a stirred solution) is described as conditions for determining the dissolution rate. The present invention is, however, not limited to this. In general, it is considered that the etching rate and the etching shape in spray etching are better than those in the dip method. The etching shape greatly depends upon etching method and conditions. A good etching shape of the laminate can be realized when the etching rate is not less than 3 μm/min at the highest etching rate in a method and conditions in which etching can be actually carried out. For this reason, in fact, in the case of etching at 70° C. by the dip method, it can be said that an etching rate of 3 μm/min provides a good etching shape. For some composition of the etching liquid, however, even in the case of an aqueous solution, the presence of a large amount of a low boiling solvent, such as methanol, sometimes renders etching at 70° C. impracticable. In this case, conditions should be separately determined according to the etching liquid.

In the present invention, the polyimide resin may be generally any one so far as the resin has a polyimide structure. The polyimide resin may be in the form of a film before stacking. Alternatively, the polyimide may be coated in the form of a solution or a solution of a precursor followed by drying or imidation to form a resin layer.

In the laminate according to the present invention, preferably not less than 50%, more preferably 100%, in terms of molar fraction of the divalent organic group contained in $R_1$ in formula (1) or (2) is accounted for by a divalent organic group represented by formula (3):

(3)

wherein n is an integer of 1 to 15.

According to a preferred embodiment of the present invention, 100% of the divalent organic group contained in $R_1$ in formula (1) or (2) is accounted for by a divalent organic group represented by formula (3) and not less than 30%, preferably not less than 80%, in terms of molar fraction of the divalent organic group contained in $R_2$ is accounted for by a divalent organic group represented by formula (4):

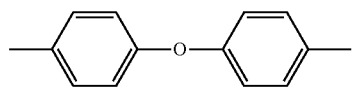

(4)

Preferably, at least one of the resin layers (insulating layers) constituting the insulating layer in the laminate according to the present invention is formed of a low expansion resin having a coefficient of expansion of 0 to 40 ppm. In particular, a low expansion polyimide resin is preferred from the viewpoint of suitability for etching. The use of the low expansion resin enables the coefficient of thermal expansion of the low expansion resin in the insulating layer to be made close to the coefficient of thermal expansion of the inorganic material layer. This can prevent warpage of the laminate.

Out of the resin layers constituting the insulating layer in the laminate according to the present invention, at least one layer should be formed of a polyimide resin. In this case, all the resin layers constituting the insulating layer may be formed of a polyimide resin.

In the laminate according to the present invention, the insulating layer, which forms an interface with at least one of the inorganic material layers, is preferably formed of a polyimide resin such that 100% of the divalent organic group contained in $R_1$ in formula (1) or (2) is accounted for by a divalent organic group represented by formula (3) and not less than 80% in terms of molar fraction of the divalent organic group contained in $R_2$ is accounted for by a divalent organic group represented by formula (4).

According to a preferred embodiment of the present invention, the insulating layer included in the layer construction of the laminate has a laminate structure of first insulating layer/second insulating layer/third insulating layer, the first insulating layer and the third insulating layer are formed of a polyimide resin having a structure such that 100% of the divalent organic group contained in $R_1$ in formula (1) or (2) is accounted for by a divalent organic group represented by formula (3) and not less than 80% in terms of molar fraction of the divalent organic group contained in $R_2$ is accounted for by a divalent organic group represented by formula (4), and the second insulating layer is formed of a low expansion polyimide resin having a coefficient of expansion of 0 to 40 ppm.

The inorganic material layers in the laminate according to the present invention may be such that both the inorganic material layers are formed of copper alloy, both the inorganic material layers are formed of copper, one of the inorganic material layers is formed of copper with the other inorganic material layer being formed of copper alloy, or one of the inorganic material layers is formed of copper or copper alloy with the other inorganic material layer being formed of stainless steel.

The insulating film according to the present invention comprises two or more resin layers, at least one of the resin layers being formed of a polyimide resin which has a structure comprising repeating units represented by formula (1) and has a glass transition point of 150 to 360° C. and is dissolvable in a basic solution at a rate of more than 3 μm/min.

Another insulating film according to the present invention comprises two or more resin layers, at least one of the resin layers being formed of a polyimide resin which has a structure comprising repeating units represented by formula (2) and has a glass transition point of 150 to 360° C. and is dissolvable in a basic solution at a rate of more than 3 μm/min.

The insulating film according to the present invention is useful as an intermediate material for stacking onto an inorganic material layer. The construction of the insulating film according to the present invention may be the same as the construction of the insulating layer in the laminate according to the present invention.

Preferably, at least one of the resin layers (insulating layers) constituting the insulating film according to the present invention is formed of a low expansion polyimide resin having a coefficient of expansion of 0 to 40 ppm. The use of the low expansion polyimide resin enables the coefficient of thermal expansion of the polyimide resin to be made close to the coefficient of thermal expansion of the inorganic material layer. Therefore, when this insulating film is stacked onto an inorganic material layer, the warpage of the laminate can be prevented.

The laminate or insulating film according to the present invention may be etched to produce electronic circuit components. Electronic circuit components, which can be suitably produced from the laminate or insulating film according to the present invention, include suspensions for hard disk drives (HDDs).

Etching by the dry process or etching by the wet process is applicable to etching of the laminate or insulating film according to the present invention. In the laminate or insulating film according to the present invention, at least one of the layers constituting the insulating layer is formed of a polyimide resin which comprises repeating units represented by formula (1) or (2) and has a glass transition point of 150 to 360° C. and is dissolvable in a basic solution at a rate of more than 3 μm/min. By virtue of this constitution, advantageously, even the wet process can realize etching with high accuracy, the productivity of etching is high, and the apparatus cost is also low.

A basic solution may be used in etching by the wet process of the insulating layer in the laminate or insulating film according to the present invention. The basic solution is preferably an alkali-amine solution, for example, an alkali-amine solution described in Japanese Patent Laid-Open No. 195214/1998, hereby incorporated by reference. However, the basic solution is not particularly limited to this only. The base component may be either an organic base or an inorganic base, or alternatively, may be a mixture of the above bases. The basic solution preferably has pH 8 to 14, particularly preferably pH 12 to 14.

Japanese Patent Laid-Open No. 195214/1998 describes a resin etching solution that comprises an aliphatic alcohol, an aliphatic amine, an alkali metal hydroxide compound and water, and as aliphatic alcohols there may be used monohydric alcohols such as methyl alcohol, ethyl alcohol, propyl alcohol, butyl alcohol and cyclohexanol; methoxyethanol, ethylene glycol monomethyl ether and isomers thereof, as well as ethylene glycol, propylene glycol, trimethylene glycol, butylene glycol, tetramethylene glycol, pentamethylene glycol, diethylene glycol, triethylene glycol and polyethylene glycols of molecular weight up to about 500.

These aliphatic alcohols preferably have higher boiling points than the etching temperature in order to ensure maintenance and stability of the solution composition, and the number of carbon atoms is preferably lower in order avoid reducing the concentration of other components in the etching solution while maintaining a constant hydroxyl concentration in the etching solution. Ethylene glycol and propylene glycol are preferred from this standpoint, while methanol and ethanol, though having low carbon numbers, also have low boiling points and are therefore not preferred for etching of polyimide films with high chemical resistance, such as the aforementioned Upilex S.

These aliphatic alcohols have the effect of improving the etching rate even when present in small amounts, but their effect is minimal if added at under 1%, while their admixture at greater than 40% is not preferred since it lowers the concentration of the other effective components, thus reducing the etching effect. From this standpoint, they are used in a range of 1%-40%, and most preferably 5%-30%.

The aliphatic amine used may be a monovalent amine which includes primary amines such as n-butylamine, amylamine and hexylamine, secondary amines such as diethylamine, dipropylamine, diisopropylamine and dibutylamine, and tertiary amines such as triethylamine, tripropylamine and tributylamine; or a divalent amine which includes ethylenediamine, triethylenediamine, tetramethyldiamine, pentamethylenediamine and hexamethylenediamine.

In addition, a water-soluble primary or secondary amine with an alcoholic hydroxyl group in the same molecule, such as a hydroxyalkylamine, or a mixture of the primary and secondary amines, may also be added. Such primary and secondary amines with a hydroxyl group include ethanolamine, propanolamines such as n-propanolamine or isopropanolamine, butanolamines such as n-butanolamine or 2-amino-1-butanol, and N-(beta-aminoethyl)ethanolamine, diethanolamine, dipropanolamine, N-methylethanolamine and N-ethylethanolamine.

The best etchability is achieved with systems using monovalent or divalent aliphatic primary amines, and they are preferred because they provide more economical etching rates for forming throughholes of prescribed dimension and shape in polyimide films with high chemical resistance, such as the aforementioned Upilex S on which metal patterns are formed.

There is also no problem with using a hydroxyalkylamine with the structures of an aliphatic alcohol and aliphatic amine in the same molecule, to constitute part of the aliphatic alcohol or aliphatic amine.

On the other hand, in the case of polyimide films which are more easily etched, such as the aforementioned Kapton or Apical, the object may be sufficiently achieved by adding an aliphatic secondary amine to an aliphatic primary amine, or with an aliphatic secondary amine alone. Tertiary amines are not preferred because they do not give economical etching rates even with Kapton or Apical, and also cause swelling and minute cracking in the polyimide resin.

The concentration of the aliphatic amine may be 8%-70%, and preferably 10%-40% based on the aqueous etching composition solution. If the concentration of the aliphatic amine is too low the etching rate is lowered, and if it exceeds 70% the concentration of the other essential component, the alkali metal compound, is reduced and the etching rate is lowered.

In addition, the alkali metal compound is most preferably potassium hydroxide from the standpoint of an economical etching rate, but other substances such as sodium hydroxide and lithium hydroxide may also be used, either alone or in admixture.

Also, they may be used in concentrations of from 5% to saturation at the temperature used; a lower concentration is not preferred as it can result in a slower etching rate and more destruction of the etching hole pattern (flawed shape and dimensions), while conversely a high concentration can result in blockage of pipes at lower temperatures, and therefore a concentration of about 10%-48% is preferred. Generally, 20%-45% is more preferred for an economical etching rate and to prevent destruction of etching hole patterns.

The etching temperature must be appropriately selected depending on the type of polyimide resin for etching. It is generally in the range of from 20° C. to the boiling point of the system, and preferably 30° C.-90° C. When the polyimide film is to be etched on one side, the difference in diameter on the upper and lower sides of the punched etching hole will produce a taper, and addition of urea is effective for reducing the degree of taper. The etching rate will not be affected even when urea is added.

Also, addition and mixture of an organic polar solvent is preferred when necessary as it can result in smoother etching hole walls and help to remove the etching residue. A suitable organic polar solvent is N-methyl-2-pyrrolidone (NMP). Urea and an organic polar solvent may both be added as well.

For the polyimide resin used in the laminate according to the present invention, the 90-degree peel strength from the resin or inorganic material, which forms an interface therewith, is preferably not less than 100 g/cm, more preferably not less than 300 g/cm, still more preferably not less than 700 g/cm.

The insulating film according to the present invention may be stacked onto an inorganic material layer to form a laminate which is then etched, or alternatively, may be etched before stacking. Specifically, the insulating film may be used as follows.

An inorganic material layer, which serves as a substrate with wiring being formed thereon, is bonded onto both sides of the insulating film, and the insulating film is then etched.

After the formation of wiring on a substrate of an inorganic material layer, the insulating film is bonded to the substrate. Thereafter, an inorganic material layer is applied onto the surface of the insulating film, and the inorganic layer and the insulating film are etched.

A previously etched insulating film is applied to an inorganic material layer.

A film formed by coating of a resin or a resin film may be used in the insulating layer in the laminate or the insulating film according to the present invention.

Second Invention

An object of the second invention is to provide a laminate having a laminate construction of first metal layer/insulating layer/second metal layer or a laminate construction of metal layer/insulating layer, the insulating layer comprising a plurality of layers, which laminate enables the insulating layer having an adhesive layer to be etched under optimal conditions, particularly a laminate best suited for etching by wet process which can realize continuous etching of a continuous laminate, has high productivity, and, in addition, has low apparatus cost.

The present inventors have made extensive and intensive studies on the etching rate ratio of resin layers, which can provide a good etching shape, in a laminate having a layer construction of first inorganic material layer (mainly metal layer)/insulating layer/second inorganic material layer (mainly metal layer) or a layer construction of inorganic material layer (mainly metal layer)/insulating layer wherein the insulating layer in the laminate has a multi-layer structure of two or more resin layers. As a result, it was found that a good etching shape is obtained when the etching rate ratio of the resin layers falls within the range of 6:1 to 1:1, preferably 4:1 to 1:1.

Thus, according to the present invention, there is provided a laminate having a layer construction of first inorganic material layer/insulating layer/second inorganic material layer or a layer construction of inorganic material layer/insulating layer, the insulating layer having a multi-layer structure of two or more resin layers, the ratio of the etching rate of the resin layer having a higher etching rate to the etching rate of the resin layer having a lower etching rate in the insulating layer being in the range of 6:1 to 1:1, preferably in the range of 4:1 to 1:1. In the present invention, the etching rate refers to the degree of a reduction in film thickness per unit time caused by etching.

In the laminate of the present invention, the adhesive strength of the adhesive layer to the inorganic material layer or the core insulating layer is preferably not less than 300 g/cm for all the adherends, more preferably not less than 1000 g/cm for all the adherends.

Inorganic materials usable in the laminate according to the present invention include, but are not particularly limited to, metals, single crystal silicon, and metal oxides. Metals include, but are not particularly limited to pure metals, such as copper and iron, and alloys such as stainless steel. Further, metals having thereon a nonmetallic inorganic material layer, for example, a ceramic layer, produced by surface treating metals may also be used. In particular, when the laminate according to the present invention is used in suspensions for hard disk drives, properties as a spring are required. Therefore, a laminate of a highly elastic metal, such as stainless steel, and a copper foil or a copper alloy foil as wiring is preferred.

According to another aspect of the present invention, there is provided an insulating film comprising two or more resin layers, the ratio of the etching rate of the resin layer having a higher etching rate to the etching rate of the resin layer having a lower etching rate being in the range of 6:1 to 1:1.

The laminate according to the present invention may be produced by any process without particular limitation. Specific examples of production processes include: a process which comprises the steps of either coating a polyimide solution directly on a metal and drying the coated metal, or coating a precursor of polyimide onto a metal, drying the coated metal and thermally imidating the precursor, thereby forming an adhesive insulating layer onto the metal, and then thermally contact bonding the adhesive insulating layer to a film as a core insulating layer; and a process which comprises the steps of coating a solution of polyimide resin, which can serve as the core insulating layer, or a precursor thereof onto an polyimide adhesive insulating layer provided on a metal, drying the coated metal, or thermally imidating the precursor after the drying, to provide a core insulating layer, providing an adhesive insulating layer on the core insulating layer according to the above procedure, and thermally contact bonding the assembly to a metal to prepare a laminate material. Further, a process may be adopted wherein the insulating film according to the present invention, which has been brought to a resin film form, is bonded to a substrate and/or an inorganic material layer as wiring.

The laminate or insulating film according to the present invention can be etched, preferably by wet process, to produce electronic circuit components. In the production of electronic circuit components using the insulating film, a method may be adopted wherein the insulating film according to the present invention is stacked onto an inorganic material to prepare a laminate which is then etched, preferably by the wet process, to prepare an electronic circuit component.

In the present invention, mere "etching" means not only wet process but also dry process.

Further, in the present invention, the "laminate" or "stacking" means not only stacking of a film form but also the formation of a specific layer onto a substrate.

BRIEF DESCRIPTION OF THE DRAWINGS

FIG. 1 is a conceptual diagram showing the etching shape of a laminate in its cross section, wherein a laminate for a wireless suspension, having a layer construction of first metal layer/adhesive insulating layer/core insulating layer/adhesive insulating layer/second metal layer, which has hitherto been etched only by the dry process, has been etched by the wet process from the first metal layer side;

FIG. 3 is a cross-sectional view of a laminate before processing and the laminate after plasma etching or wet etching with an alkali solution;

FIG. 4 is a graph wherein dipping time (sec) is plotted as abscissa and degree of reduction in film thickness (μm), defined as a value obtained by subtracting film thickness after dipping from initial film thickness, is plotted as ordinate;

FIG. 5 is an SEM (scanning electron microscope) photograph showing an etching shape of a three-layer material using film A with an adhesive layer;

FIG. 6 is an SEM (scanning electron microscope) photograph showing an etching shape of a three-layer material using film B with an adhesive layer;

BEST MODE FOR CARRYING OUT THE INVENTION

Figure 2:
FIG. 2 is an SEM (scanning electron microscope) photograph of an etching shape of a laminate using polyimide A prepared in Example A2.

The present invention will be described in detail.
First Invention

In a laminate, for use in electronic members, composed of an inorganic material layer, composed mainly of a metal layer, and an insulating layer, in order to prevent the warpage of the laminate and, in addition, to improve the adhesion between the insulating layer and the inorganic material layer, as described above, the insulating layer portion has a laminate structure such that a thermoplastic adhesive insulating layer is provided on one side or both sides of a low expansion core insulating layer. In general, an adhesive resin has a high coefficient of thermal expansion and, thus, when as such is stacked onto a metal, causes a warpage. Therefore, the thickness of the low expansion core insulating layer, the coefficient of thermal expansion of which has been made identical to the coefficient of the thermal expansion of the metal, is made larger than the thickness of the adhesive insulating layer to prevent noticeable warpage from appearing in the whole laminate. The smaller the thickness of the adhesive insulating layer, the better the effect of preventing warpage. When the thickness is excessively small, however, the adhesion is sometimes deteriorated. Further, at least when the total thickness of the upper and lower adhesive insulating layers respectively overlying and underlying the core insulating layer is not more than the half of the thickness of the core insulating layer, the warpage is less likely to appear.

In etching the laminate by the wet process, when the plurality of insulating resin layers are different from each other in etching rate, in general, the edge shape is not straight and the layer having a lower etching rate remains unetched. For example, in the laminate shown in FIG. 1, when the etching rate of the adhesive insulating layer is low, the etching shape is such that the upper and lower surfaces are projected. On the other hand, when the etching rate relationship is opposite to the above relationship, the adhesive insulating layer is etched earlier. In this case, the resultant etching shape is such that the center portion is projected.

Etching of a polyimide resin with an alkali solution will be taken as an example. In this etching, the imide bond is attacked by hydroxide ions in the solution, resulting in the formation of polyamic acid. Even in this state, the solubility of the polyamic acid in the alkali solution is higher than the solubility of the polyimide in the alkali solution. Since the amide group of the amic acid is further attacked by hydroxide ions and consequently is hydrolyzed to lower the molecular weight of the polymer, the solubility is improved. When a hydrolyzable group is present in the molecular chain, this site is sometimes hydrolyzed.

By virtue of this mechanism, in the case of a linear polymer, the etching rate is not very influenced by the molecular weight of the polymer. In fact, the above hypothesis is also supported by experimental data obtained by the present inventors.

General-purpose low expansion polyimides are divided in terms of constitution into polyimides using pyromellitic acid dianhydride as the main skeleton and polyimides using biphthalic acid dianhydride as the main skeleton. It is known that, when pyromellitic acid dianhydride is used in the insulating layer, alkali resistance is less likely to develop, for example, due to an influence of an electronic factor derived from structure, that is, etchability with an alkali is poor. For this reason, preferably, the low expansion polyimide serving as the core insulating layer in the insulating layer of the laminate according to the present invention has pyromellitic acid dianhydride in its structure. On the other hand, biphthalic acid dianhydride polyimides are known to have good alkali resistance. When the use of biphthalic acid dianhydride polyimides as the core insulating layer in the insulating layer according to the present invention is contemplated, the selection of diamine as another material for the polyimide is preferred from the viewpoint of suppressing the development of the alkali resistance.

In the adhesive thermoplastic resin, the use of the pyromellitic acid dianhydride as the main skeleton is difficult. This is because, when pyromellitic acid dianhydride is used, the thermoplasticity is less likely to develop and, thus, the adhesion is not very good. Therefore, the present inventors have paid attention to bistrimellitic acid dianhydride as an acid dianhydride which has a structure similar to pyromellitic acid dianhydride, has in its skeleton an ester bond hydrolyzable with hydroxide ions, and has a skeleton having a flexibility high enough to develop thermoplasticity.

Since the trimellitic acid per se has a structure similar to pyromellitic acid, there is no particular limitation on a site for connecting trimellitic acid. However, bistrimellitic acid dianhydride having a hydrocarbon diol is preferred from the viewpoint of easily imparting thermoplasticity to the whole resin.

Among others, polyimide resins, which have been produced using ethylene glycol bistrimellitic acid dianhydride (abbreviation: TMEG) as a starting material, have hitherto been fully studied and have been reported to have good adhesion (Japanese Patent Laid-Open Nos. 152647/1998 and 168187/1998).

The resin for forming the adhesive insulating layer used in the laminate or insulating film according to the present invention is mainly a polyimide or a resin similar thereto. The resin, however, is not particularly limited, so far as a skeleton derived from bistrimellitic acid dianhydride is present within the skeleton of the resin, and the imide bond content has no influence so far as the resin has heat resistance and insulating properties. Further, a material, which has a structure similar to the above-described ethylene glycol bistrimellitic acid dianhydride (abbreviation: TMEG) and wherein the number of carbon atoms between oxygen atoms at the ethylene glycol site is not 2, is also considered to have the same hydrolysis resistance. TMEG, however, is most preferred from the viewpoints of cost and reactivity with an alkali.

Regarding components other than TMEG in the polyimide resin used in the adhesive insulating layer, other acid anhydride component may be contained in the structure in such an amount that is not detrimental to the properties. Other acid anhydrides include, but are not particularly limited to, in addition to bistrimellitic acid dianhydride, diphenylsulfone-2,3,3',4'-tetracarboxylic acid dianhydride, diphenylsulfone-2,2',3,3'-tetracarboxylic acid dianhydride, pyromellitic acid dianhydride, benzophenonetetracarboxylic acid dianhydride, 2,3,3',4'-biphenyltetracarboxylic acid dianhydride, 3,3',4,4'-biphenyltetracarboxylic acid dianhydride, 2,3,3',4'-diphenyl ether tetracarboxylic acid dianhydride, 2,3,3',4,4'-diphenyl ether tetracarboxylic acid dianhydride, and 1,4,5,8-naphthalenetetracarboxylic acid dianhydride.

Diamines as the starting material of the polyimide resin used in the adhesive insulating layer include aliphatic diamines, aromatic diamines represented by formula (5), or aromatic diamines represented by formula (6). These diamines may be used solely or as a mixture of two or more.

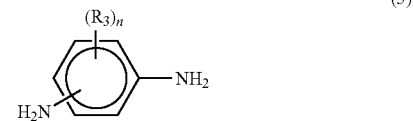

(5)

wherein $R_3$ represents an alkyl, fluorine-substituted alkyl, alkoxyl, or halogen group; and n is an integer of 0 to 4, provided that $nR_3$s may be the same or different; and

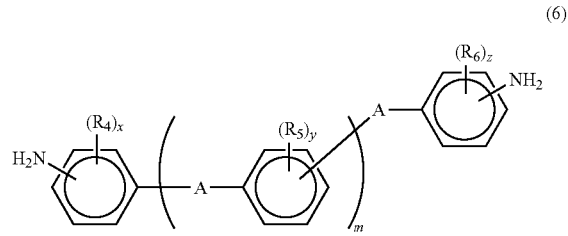

(6)

wherein A represents a bond group selected from the group consisting of a group of single bonds, —O—, —CH$_2$—, —CO—, —C(CH$_3$)$_2$—, —C(CF$_3$)$_2$—, —S—, and —SO$_2$—; $R_4$, $R_5$, and $R_6$ may be the same or different and have the same meanings as $R_3$; x, y, z, and m are an integer of 0 to 4; and (m+1) As may be the same or different.

Examples of aliphatic diamines include 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, and 1,10-diaminodecane.

Examples of aromatic diamines represented by formula (5) or (6) include o-phenylenediamine, m-phenylenediamine, p-phenylenediamine, 2,4-toluenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylmethane, 3,3'-diaminobenzophenone, 4,4'-diaminobenzophenone, 3,3'-diaminodiphenyl sulfide, 4,4'-diaminodiphenyl sulfide, 1,3-bis(3-aminophenoxy)benzene, 1,4-bis(3-aminophenoxy)benzene, 1,4-bis(4-aminophenoxy)benzene, 2,2-bis[4-(3-aminophenoxy)phenyl]propane, 2,2-bis[4-(4-aminophenoxy)phenyl]propane, 4,4'-bis(p-aminophenoxy)-diphenylsulfone, 3,4'-bis(p-aminophenoxy)diphenylsulfone, 3,3'-bis(p-aminophenoxy)diphenylsulfone, and 4,4'-bis(4-aminophenoxy)biphenyl.

The diamine as the starting material for the polyimide resin used in the adhesive insulating layer is preferably an aromatic diamine rather than the aliphatic diamine, for example, from the viewpoint of heat resistance.

The thermoplastic resin used in the insulating layer of the laminate according to the present invention is a resin having a glass transition point (Tg) below the thermal decomposition temperature. In general, the glass transition point is determined by differential thermal analysis. If necessary, however, the tan δ peak as determined by dynamic viscoelasticity measurement may be regarded as the glass transition point. According to the present invention, Tg was determined based on the dynamic viscoelasticity. For example, when the resin is brittle and cannot withstand the measurement of the dynamic viscoelasticity, however, the glass transition point may be determined by the differential thermal analysis.

When conditions for thermal contact bonding in the formation of the laminate are taken into consideration, the glass transition point is preferably 360° C. or below. The glass transition point is preferably 150° C. or above from the viewpoint of heat resistance such as soldering heat resistance. A resin, wherein the storage modulus is as low as possible at a temperature of the glass transition point or above, is likely to develop adhesion even when any high pressure is not applied.

According to the present invention, the etching rate refers to the degree of a reduction in film thickness per unit time when the laminate is brought into contact with an etching liquid. In this case, the temperature may be any value so far as the etching liquid is kept in the liquid state. The laminate may be brought into contact with the etching liquid by any method, and examples thereof include dipping and spraying. An additive may be added to the resin used in the laminate according to the present invention so far as the etchability is not sacrificed.

In general, the higher the etching temperature, the shorter the time necessary for the etching. Therefore, the etching temperature is preferably 40° C. or above, more preferably 60° C. or above. Since, however, a component, which is evaporated at that temperature, is contained in the etching liquid, when the vaporization of this component results in deteriorated service life of the etching liquid and operability, the etching is preferably carried out at a temperature such that such properties are not deteriorated. The etching liquid is in many cases soluble in water. In this case, the etching liquid is likely to boil. Therefore, the etching is preferably carried out at a temperature of 110° C. or below.

In working examples described below, the etching rate is measured at 70° C. The temperature 70° C. was merely selected as a measure. Therefore, the etching is preferably carried out under temperature and other conditions which permit the etching liquid to realize the optimal etching. In this case, a resin having an etching rate of lower than 3 μm/min causes problems such as blind over edging or a sectional form which is not straight. Therefore, this type of resin is unfavorable, and the laminate using this type of resin cannot be put to practical use.

A basic solution may be used in etching by the wet process of the insulating layer in the laminate or insulating film according to the present invention. The basic solution is preferably an alkali-amine solution, for example, an alkali-amine solution described in Japanese Patent Laid-Open No. 195214/1998. However, the basic solution is not particularly limited to this only. The base component may be either an organic base or an inorganic base, or alternatively, may be a mixture of the above bases. The basic solution preferably has pH 8 to 14, particularly preferably pH 12 to 14.

For the polyimide resin used in the laminate according to the present invention, the 90-degree peel strength from the resin or inorganic material, which forms an interface therewith, is preferably not less than 100 g/cm, more preferably not less than 300 g/cm, still more preferably not less than 700 g/cm.

The polyimide resin used in the adhesive insulating layer may be synthesized by any method without particular limitation, and examples thereof include: a method wherein polyamic acid is produced in a solution and coated followed by thermal imidation; and a method wherein heating under reflux in a solution is carried out for imidation. Alternatively, chemical imidation in the presence of a dehydration catalyst, such as acetic anhydride, may be adopted for the synthesis of the polyimide resin.

Inorganic materials usable in the laminate according to the present invention include, but are not particularly limited to, metals, single crystal silicon, and metal oxides. Metals include, but are not particularly limited to pure metals, such as copper and iron, and alloys such as stainless steel. Metals having thereon a nonmetallic inorganic material layer, for example, a ceramic layer, produced by surface treating metals may also be used. In particular, when the laminate according to the present invention is used in suspensions for hard disk drives, properties as a spring are required. Therefore, a laminate of a highly elastic metal, such as stainless steel, and a copper foil or a copper alloy foil as wiring is preferred.

The laminate may be produced by any process without particular limitation. Specific examples of production processes include: a process which comprises the steps of either coating a polyimide solution directly on a metal and drying the coated metal, or coating a precursor of polyimide onto a metal, drying the coated metal and thermally imidating the precursor, thereby forming an adhesive insulating layer onto the metal, and then thermally contact bonding the adhesive insulating layer to a film as a core insulating layer; and a process which comprises the steps of coating a solution of polyimide resin, which can serve as the core insulating layer, or a precursor thereof onto a polyimide adhesive insulating layer provided on a metal, drying the coated metal, or thermally imidating the precursor after the drying, to provide a core insulating layer, providing an adhesive insulating layer on the core insulating layer according to the above procedure, and thermally contact bonding the assembly to a metal to prepare a laminate material. Further, a process may be adopted wherein the insulating film according to the present invention, which has been brought to a resin film form, is bonded to a substrate and/or an inorganic material layer as wiring to prepare a laminate.

In general, the weight average molecular weight of the resin used in the adhesive insulating layer in the laminate according to the present invention is preferably 6000 to 500000, particularly preferably 8000 to 100000, from the viewpoint of suitability for production process of the laminate or film, although the suitable weight average molecular weight varies depending upon the molecular structure. When the molecular weight is not less than 500000, it is difficult to provide homogeneous coating. On the other hand, when the molecular weight is not more than 6000, the film formability is poor and, thus, the formation of a coating having even adhesion is difficult.

The adhesive may be coated in a solution form, or alternatively, other method may be used. Further, a precursor or a derivative thereof may be coated, followed by treatment to form a desired structure.

Electronic Circuit Components

Electronic circuit components can be generally produced by the following method. However, the production method is not limited to the following method.

At the outset, a photosensitive resin layer is coated or laminated on the surface of a metal, on its side where the formation of a circuit is desired, in the laminate according to the present invention. A mask with a desired pattern image being drawn thereon is brought into intimate contact with the photosensitive resin layer, followed by exposure to an electromagnetic wave with wavelength to which the photosensitive resin is sensitive. Thereafter, when the photosensitive resin is of a positive-working type, the exposed area is eluted with a predetermined developing solution. On the other hand, when the photosensitive resin is of a negative-working type, the unexposed area is eluted with a predetermined developing solution. Thus, a desired circuit image is formed on the metal. The metal with the circuit image formed thereon is then immersed in a solution capable of dissolving the metal, such as an aqueous ferric chloride solution. Alternatively, this solution may be sprayed on the substrate. Thus, the metal exposed on the surface is eluted, and the photosensitive resin is then peeled off by a predetermined peeling solution to form a circuit.

Next, an insulating layer is patterned by the dry or wet process on the circuit formed on the substrate in the same manner as described above in connection with the patterning of the metal layer. For example, in the case of the wet process, a mask with a predetermined pattern image being drawn thereon is intimately contacted, and an electromagnetic wave with wavelengths, to which the photosensitive resin is sensitive, is applied. A predetermined developing solution is used to elute exposed areas in the case of positive-working photosensitive resin and to elute unexposed areas in the case of negative-working photosensitive resin to form a predetermined pattern. In this state, the patterned product is immersed in a solution for dissolving the resin constituting the insulating layer, for example, an alkali-amine polyimide etching liquid, or alternatively, the solution is sprayed on the substrate. Thus, the exposed insulating layer resin is eluted, and the photosensitive resin is then separated with a predetermined peeling solution.

For a suspension using stainless steel as the inorganic material layer prepared by the plasma etching process and a suspension having the same construction as the above suspension except that wet etching was used for the production of the suspension, the results of an analysis of the surface of the stainless steel in both the suspensions show that, in the case of the suspension produced by the plasma etching process, the resin used in the insulating layer is removed and the exposed metal surface is reacted with plasma to give an inorganic nitride surface and/or an inorganic fluoride surface. The reason why, in the case of the plasma etching process, an inorganic nitride and/or an inorganic fluoride are detected on the surface of the metal, is probably as follows. The plasma etching gas has a high temperature of 200° C. or above, the surface of the stainless steel is exposed after the removal of the resin, such as polyimide, as the insulating layer, and the exposed surface of the stainless steel is reacted with plasma to form the inorganic nitride and/or the inorganic fluoride.

On the other hand, in the case of a suspension, which has realized a good etching shape by the wet etching process, neither an inorganic nitride nor an inorganic fluoride has been detected from the surface of the stainless steel exposed after the removal of the polyimide, indicating that no change took place in the surface. This is a feature inherent in electronic circuit components, such as suspensions, which for the first time have become possible to be produced by the wet etching process according to the present invention. The reason why, in the case of the wet etching process, any change in metal surface is not observed, is probably as follows. The chemical liquid used in the wet etching is mainly an alkaline solution. In general, the alkaline solution has lower reactivity with metals than with organic materials. Further, the processing temperature is low and is 100° C. or below, and the processing time is as short as several minutes. Therefore, the processing is less likely to change the surface of the stainless steel exposed after the removal of the polyimide.

Second Invention

In a laminate, for use in electronic members, composed of a metal layer and an insulating layer, in order to prevent the warpage of the laminate and, in addition, to improve the adhesion between the insulating layer and the metal layer, as described above, the insulating layer has a laminate structure such that a thermoplastic adhesive layer is provided on both sides of a low expansion core insulating layer. Preferably, at least one layer constituting the insulating layer is formed of a polyimide resin. If necessary, all the layers constituting the insulating layer may be formed of a polyimide resin.

Since, however, the adhesive thermoplastic resin used in the adhesive layer has a high coefficient of thermal expansion, stacking of the adhesive layer onto the metal layer is likely to cause warpage. Therefore, it is important that the thickness of the core insulating layer of a low expansion resin selected from resins having a coefficient of thermal expansion similar to that of the metal layer be made larger than the thickness of the adhesive layer to suppress the appearance of the warpage of the whole laminate on the surface of the laminate. The smaller the thickness of the adhesive layer as compared with the thickness of the core insulating layer, the lower the level of warpage. When the thickness of the adhesive layer is excessively small, the adhesion is deteriorated. When the total thickness of the upper and lower adhesive layers respectively overlying and underlying the core insulating layer is not more than the half of the thickness of the core insulating layer, the warpage is less likely to take place.

In the layer construction of the insulating layer in the laminate according to the present invention, as described above, particularly in the case of etching by the wet process, when the resin layers constituting the insulating layer are different from each other in etching rate, in general, the edge shape is not straight and the layer having a lower etching rate remains unetched. In the laminate shown in FIG. 1, when the etching rate of the adhesive layer is excessively low, the etching shape is such that the upper and lower adhesive layers are projected. On the other hand, when the etching rate relationship is opposite to the above relationship (i.e., the etching rate of the adhesive layer is excessively high), the adhesive layer is etched earlier. As a result, the etching shape is such that the center portion is projected. Ideally, when all the layers constituting the insulating layer, that is, the core insulating layer and the adhesive layers, have an identical etching rate, the etching shape is expected to be good. In the etching by the wet process, however, the etching rate of the adhesive layer is in many cases greatly different from that of the core insulating layer.

The present inventors have drawn attention to the fact that, in a laminate having a layer construction of first metal layer/ insulating layer/second metal layer or a layer construction of metal layer/insulating layer for high precision electronic circuit components, for example, for wireless suspensions, the maximum thickness ratio between the core insulating layer and each adhesive layer constituting the insulating layer is 4:1. Based on this, the present inventors have framed a hypothesis such that, when the adhesive layer has an etching rate of one-fourth of the etching rate of the core insulating layer, the adhesive layer and the core insulating layer are etched in an identical time and, thus, a good etching shape can be obtained. The present inventors have experimentally demonstrated that this hypothesis is correct.

In general, the rate of etching of materials with an etchant is considered to vary from material to material, and is a value determined by conditions for the measurement of the etching rate. It is also considered that the etching rate would vary depending, for example, upon etching conditions, such as temperature and etching techniques. In the laminate or the insulating film according to the present invention, however, the shape after etching is important. Therefore, in the present invention, the etching rate may be measured at various temperatures, which are used in actual etching, so far as the shape after etching is good. Specifically, according to the present invention, so far as the correlation between the etching rates of the layers constituting the insulating layer satisfies specific conditions, etching under the conditions can provide a good shape after etching, independently of the temperature.

The etching temperature may be substantially any temperature so far as the etchant functions as desired. In particular, when the etchant is an aqueous solution, the etching temperature is preferably between 0° C. and 110° C. The etching rate generally decreases with lowering the temperature, and when the temperature is high, the etchant boils, resulting in deteriorated handleability. For this reason, the etching temperature is more preferably in the range of 30 to 90° C. Still more preferably, the etching is carried out at 50 to 90° C. from the viewpoint of suppressing a change in composition of the etchant, for example, due to evaporation of the component, and shortening the etching time.

Regarding the core insulating layer, in order to prevent the warpage of the laminate, a material having a coefficient of thermal expansion identical to the metal is used. On the other hand, the adhesive layer is formed of a thermoplastic resin from the viewpoint of imparting the adhesion. The coefficient of thermal expansion of this type of the adhesive layer, however, is larger than that of the metal layer, and, thus, this is causative of the warpage of the laminate. Therefore, preferably, the thickness of the adhesive layer is made smaller than that of the core insulating layer to prevent warpage of the laminate.

In general, in the case of the provision of two adhesive layers, when the total thickness of the two adhesive layers is smaller than the thickness of the core insulating layer, no warpage takes place. Ideally, the total thickness of the adhesive layers is preferably not more than the half of the thickness of the core insulating layer. For this reason, the thickness of each layer in the adhesive layer is preferably not more than one-fourth of the thickness of the core insulating layer. When the level of concaves and convexes in the surface of the metal layer exceeds the thickness of the adhesive layer, however, the adhesive layer does not bite into the concaves and convexes and in some cases does not develop the adhesive power. Therefore, the lower limit of the thickness of the adhesive layer is preferably the maximum difference in level between the concaves and convexes of the surface of the metal layer.

Etching of a polyimide resin with an alkali solution as an etching solution for resin by the wet process will be taken as an example. In this etching, the imide bond is attacked by hydroxide ions in the solution, resulting in the formation of polyamic acid. Even in this state, the solubility of the polyamic acid in the alkali solution is higher than the solubility of the polyimide in the alkali solution. Since the amide group of the amic acid is further attacked by hydroxide ions and consequently is hydrolyzed to lower the molecular weight of the polymer, the solubility is considered to be improved. When a hydrolyzable group is present in the molecular chain, this group site is sometimes hydrolyzed.

By virtue of this mechanism, in the case of a linear polymer, it is considered that the etching rate is not very influenced by the molecular weight of the polymer. In fact, the above hypothesis is also supported by experimental data obtained by the present inventors.

In Japanese Patent Laid-Open No. 164084/1994 described above as the prior art, in a laminate comprising a polyimide film, with a copper foil being stacked onto one side thereof, and a polyimide having excellent adhesion applied onto the polyimide film, the polyimide layer having a lower etching rate is disposed on a side, which is to be exposed to the etching liquid, to prevent side etching of the polyimide layer. On the other hand, in the laminate according to the present invention, the polyimide layers may be disposed in any order from the side to be exposed to the etching liquid. That is, the polyimide layer disposed on the side to be exposed to the etching solution may be one having a higher etching rate or one having a lower etching rate. In the present invention, an etching rate range, which can provide an acceptable etching shape in the plurality of polyimide layers, is specified. Therefore, according to the theory of Japanese Patent Laid-Open No. 164084/ 1994, in the case of a laminate having a layer construction of polyimide layer having lower etching rate/polyimide layer having higher etching rate/polyimide layer having lower etching rate, etching should be carried out from both sides. By contrast, according to the present invention, the etching rate range suitable for etching from one side has been found.

The resin for the adhesive layer used in the present invention is preferably mainly a polyimide or a resin similar thereto. However, the resin is not limited thereto, and the resin is regardless of the presence of the imide bond so far as the resin has heat resistance and insulating properties. Further, it should be noted that the storage modulus referred to herein is a storage modulus of the adhesive at the time of bonding of the insulating layer to an adherend, for example, by contact bonding, but not a storage modulus in such a state that, in the final form of the three-layer material, the molecular structure or the like has been changed from that in the step of bonding.

In general, the weight average molecular weight of the resin constituting the adhesive layer according to the present invention is preferably 6000 to 500000, particularly preferably 8000 to 100000, although the suitable weight average molecular weight depends upon the molecular structure. When the molecular weight is not less than 500000, it is difficult to provide homogeneous coating. On the other hand, when the molecular weight is not more than 6000, the film formability is poor and, thus, the formation of a coating having even adhesion is difficult.

The adhesive may be coated in a solution form, or alternatively, other method may be used. Further, a precursor or a derivative thereof may be coated, followed by treatment to form a desired structure.

Electronic Circuit Components

Electronic circuit components can be generally produced by the following method.

At the outset, a photosensitive resin layer is coated or laminated on the surface of a metal, on its side where the formation of a circuit is desired, in the laminate according to the present invention. A mask with a desired pattern image drawn thereon is brought into intimate contact with the photosensitive resin layer, followed by exposure to an electromagnetic wave with wavelength to which the photosensitive resin is sensitive. Thereafter, when the photosensitive resin is of a positive-working type, the exposed area is eluted with a predetermined developing solution. On the other hand, when the photosensitive resin is of a negative-working type, the unexposed area is eluted with a predetermined developing solution. Thus, a desired circuit image is formed on the metal. The metal with the circuit image formed thereon is then immersed in a solution capable of dissolving the metal, such as an aqueous ferric chloride solution. Alternatively, this solution may be sprayed on the substrate. Thus, the metal exposed on the surface is eluted, and the photosensitive resin is then peeled off by a predetermined peeling solution to form a circuit.

Next, in the same manner as described above, a mask with a desired pattern image being drawn thereon is brought into intimate contact with the surface of the circuit formed on the metal surface, and the insulating layer is patterned by the dry or wet process.

For a suspension using stainless steel as the inorganic material layer prepared by the plasma etching process and a suspension having the same construction as the above suspension except that wet etching was used for the production of the suspension, the results of an analysis of the surface of the stainless steel in both the suspensions show that, in the case of the suspension produced by the plasma etching process, the resin used in the insulating layer is removed and the exposed metal surface is reacted with plasma to give an inorganic nitride surface and/or an inorganic fluoride surface. The reason why, in the case of the plasma etching process, an inorganic nitride and/or an inorganic fluoride are detected on the surface of the metal, is probably as follows. The plasma etching gas has a high temperature of 200° C. or above, the surface of the stainless steel is exposed after the removal of the resin, such as polyimide, as the insulating layer, and the exposed surface of the stainless steel is reacted with plasma to form the inorganic nitride and/or the inorganic fluoride.

On the other hand, in the case of a suspension, which has realized a good etching shape by the wet etching process, neither an inorganic nitride nor an inorganic fluoride has been detected from the surface of the stainless steel exposed after the removal of the polyimide, indicating that no change took place in the surface. This is a feature inherent in electronic circuit components, such as suspensions, which for the first time have become possible to be produced by the wet etching process according to the present invention. The reason why, in the case of the wet etching process, any change in metal surface is not observed, is probably as follows. The chemical liquid used in the wet etching is mainly an alkaline solution. In general, the alkaline solution has lower reactivity with metals than with organic materials. Further, the processing temperature is low and is 100° C. or below, and the processing time is as short as several minutes. Therefore, it is considered that the processing is less likely to change the surface of the stainless steel exposed after the removal of the polyimide.

Example A1

Etching Test

For a sample, a polyimide resin (polyimide A) composed of ethylene glycol bis-trimellitic acid dianhydride and 4,4'-diaminodiphenyl ether was used as a resin for an adhesive insulating layer, and, for a comparative sample, a polyimide resin (polyimide B) composed of 3,3',4,4'-biphthalic acid dianhydride and 4,4'-diaminodiphenyl ether was used as a resin for an adhesive insulating layer. Further, a 12.5 μm-thick polyimide film APIKAL NPI (tradename, manufactured by Kanegafuchi Chemical Ind. Co., Ltd.) was used as a low expansion polyimide for a core insulating layer. An etching test was carried out using an alkali-amine polyimide etching liquid TPE-3000 (tradename) manufactured by Toray Engineering Co., Ltd. was used as an etching liquid.

Each of these adhesive resins was dissolved in the form of a polyimide in N-methyl-2-pyrrolidone (abbreviation: NMP) to prepare a solution which was spin coated onto a 100 μm-thick SUS 304 plate (manufactured by Nippon Steel Corp.) having a size of 15 cm×15 cm to a thickness of 20 to 40 μm, and the coating was dried in an oven at 180° C. for 30 min. The coated plates were cut into a size of about 1.5 cm in length× about 2 cm in width, and a cut was provided at the center of the sample plate with a cutter knife, followed by the measurement of the film thickness as an initial film thickness with a tracer type film thickness meter Dektak (Dektak 16000: tradename, manufactured by Sloan Technology). Thereafter, the sample plates were dipped in the polyimide etching liquid TPE-3000 (tradename, manufactured by Toray Engineering Co., Ltd.), which had been stirred with a magnetic stirrer regulated at 70° C. until a vortex took place, and, for each dipping time, the thickness of the film substantially in its site, where the initial film thickness had been measured, was measured with Dektak (Dektak 16000: tradename, manufactured by Sloan Technology). The film thickness after dipping was subtracted from the initial film thickness to determine the degree of reduction in film thickness. For each sample, the degree of reduction in film thickness per unit time, that is, the etching rate, is shown in Table A1 below.

TABLE A1

| Sample | Etching rate, μm/min |
| --- | --- |
| Polyimide A | About 11 μm/min |
| Polyimide B | About 0.1 μm/min |
| APIKAL NIP | About 20 μm/min |

The results show polyimide A has a high etching rate.

Example A2

Evaluation of Shape of Pattern

A 12.5 μm-thick APIKAL NPI film (tradename, manufactured by Kanegafuchi Chemical Ind. Co., Ltd.) was cut into a size of 15 cm×15 cm square which was then securely applied with a weakly pressure-sensitive adhesive tape so as not to cause cockling onto a 100 μm-thick SUS 304 plate (manufactured by Nippon Steel Corp.). Polyimide A and Polyimide B as used in Example A1 were coated onto this laminate to a film thickness of 2.5 μm±0.3 μm on a dry basis, and the coatings were dried in the same manner as in Example A1. Thereafter, the coated film was separated from the SUS plate as the support, and the film was turned over, and the film was applied so as not to cause cockling. In the same manner as described above, polyimide A and polyimide B were coated to form a film. The assembly was separated from the support. Thus, film A with an adhesive insulating layer and film B with an adhesive insulating layer were prepared.

These films each with an adhesive insulating layer were sandwiched between a 20 µm-thick SUS 304 HTA foil (tradename, manufactured by Nippon Steel Corp.) and a 18 µm-thick copper alloy foil C 7025 (tradename, manufactured by Olin Corp.) so that copper foil in its rough surface faced the film, followed by vacuum contact bonding under conditions of pressure 1 MPa and 300° C. for 10 min to prepare a three-layer material having a layer construction of SUS:insulating layer:copper.

In such a state that the SUS side was masked, the three-layer material was dipped in a ferric chloride solution, and the copper foil was etched. A 5 µm-thick alkali development-type dry film resist was heat laminated onto the exposed adhesive insulating layer surface under conditions of speed 6.5 m/min, roll surface temperature 105° C., and linear pressure 2 to 4 kg/cm, and the laminate was then allowed to stand at room temperature for 15 min. Thereafter, exposure was carried out using a predetermined mask by means of a contact exposure system at 100 mJ/cm$^2$. The exposed laminate was allowed to stand at room temperature for 15 min, and the dry film resist was then developed with a 1 wt % aqueous $Na_2CO_3$ solution under conditions of 30° C. and spray pressure 2 kg for 40 sec.

Thereafter, the dry film resist was dried, and was dipped in an etching liquid TPE-3000 (tradename, manufactured by Toray Engineering Co., Ltd.) which had been stirred at 70° C. with a magnetic stirrer to such an extent that a vortex took place. When the polyimide film was fully removed in the form of the mask, the dry film resist was taken out of the etching liquid, followed by the separation of the dry film resist with a 3 wt % aqueous NaOH solution of 50° C. at a spray pressure of 1 kg. The insulating layer, which had been brought to the desired shape, was observed through an SEM (scanning electron microscope) photograph to examine the etching shape.

The etching shape of the laminate using polyimide B was such that the adhesive insulating layer was left and was projected on the core insulating layer. For the laminate using polyimide A, the insulating layer could be removed by etching for about 2 min, and, although the taper angle was 45° C., the edge was linear and had a good shape. An SEM (scanning electron microscope) photograph of the etching shape of the laminate using polyimide A prepared in Example A2 is shown in FIG. 2.

Example A3

Evaluation of Viscoelasticity

The polyimide A as used in Example A1 was coated onto a copper foil having a size of 10 cm×10 cm and a thickness of 12 µm, and the coated copper foil was dried in an oven at 180° C. for 30 min to form an about 25 µm-thick coating. Thereafter, etching of the copper foil was carried out in 45 Baume ferric chloride having a liquid temperature of 50° C. to prepare a polyimide film (polyimide A). The film of polyimide A and a 25 µm-thick APIKAL NPI film (tradename, manufactured by Kanegafuchi Chemical Ind. Co., Ltd.) were cut into test pieces having a length of about 1.5 cm and a width of 5 mm which were then measured with a viscoelastic measuring apparatus RSA-II (tradename, manufactured by Rheometric Scientific) under conditions of sample length 8 mm, sample width 5 mm, temperature rise rate 5° C./min, frequency 3.0 Hz, and temperature rise from room temperature to 400° C.

As a result, it was found that polyimide A has a tan δ peak around 170° C. and has a softening point around that temperature. On the other hand, APIKAL NPI film (tradename, manufactured by Kanegafuchi Chemical Ind. Co., Ltd.) was found to have no tan δ peak until 400° C. and to have no thermoplasticity.

Example A4

Evaluation of Adhesion

Three adherends, an 18 µm-thick copper alloy foil C 7025 (tradename, a copper alloy foil, manufactured by Olin Corp.), a 20 µm-thick SUS 304 HTA foil (tradename, an SUS foil, manufactured by Nippon Steel Corp.), and a 75 µm-thick APIKAL NPI film (tradename, polyimide film, manufactured by Kanegafuchi Chemical Ind. Co., Ltd.), were provided, and the adhesion of the adhesive insulating layer and the resin film to the adherends were evaluated as follows.

i) Preparation of Evaluation Sample of Adhesive Polyimide Resin

Concaves and convexes were intentionally provided on the surface of the substrate so that separation does not take place between the adhesive insulating layer and the substrate and interfacial peeling between the adherend and the adhesive insulating layer or cohesive failure of the adhesive insulating layer necessarily takes place. The surface of a 100 µm-thick SUS 304 plate (manufactured by Nippon Steel Corp.) was roughened by means of a wet blaster manufactured by Macoho Co., Ltd. with alumina of #1000 as an abrasive material under conditions of pressure 0.7 kg/cm$^2$ and scanning speed 10 mm/sec, and the surface was then ultrasonically washed with pure water for 30 min to remove the abrasive deposited on the surface. In this case, both sides of the plate were roughened because roughening of only one side causes warpage of the SUS 304 substrate.

A 2 to 3 µm-thick coating of polyimide A as used in Example A1 was formed by spin coating on the surface of the SUS substrate as the substrate both sides of which have been roughened, and the coating was dried in the same manner as in Example A1 to provide an adhesive insulating layer of Example A4 on the substrate. The laminate having a layer construction of resin layer/substrate thus obtained was stacked onto each adherend, that is, a 20 µm-thick SUS 304 HTA foil (tradename, manufactured by Nippon Steel Corp.), an 18 µm-thick copper alloy foil C 7025 (tradename, manufactured by Olin Corp.), and a 75 µm-thick APIKAL NPI film (tradename, manufactured by Kanegafuchi Chemical Ind. Co., Ltd.), by vacuum contact bonding under conditions of temperature 300° C. and surface pressure 1 MPa for 10 min to prepare evaluation samples.

ii) Preparation of Evaluation Sample of Resin Film APIKAL NPI (Tradename, a Polyimide Film with a Thickness of 25 µm, Manufactured by Kanegafuchi Chemical Ind. Co., Ltd.) was Provided as a Resin Film.

Both sides of the above-described three adherends were roughened in the same manner as described above in i).

The resin film was thermally contact bonded and stacked onto each of the adherends under conditions of 300° C. and 1 MPa to prepare evaluation samples respectively having laminate structure of the following combinations.

APIKAL NPI (thickness 25 µm)-SUS 304 (thickness 20 µm)

APIKAL NPI (thickness 25 µm)-C 7025 (thickness 18 µm)

APIKAL NPI (thickness 25 µm)-APIKAL NPI (thickness 75 µm)

iii) Peel Test

Each of the samples of the above items i) and ii) was cut into a width of 1 cm with a hand push cutter, followed by a 90-degree peel test with a material tester type 5565 (tradename) manufactured by Instron at a tensile speed of 500 mm/min. The results are shown in Table A2 below.

TABLE A2

| Sample | Adherend | | |
|---|---|---|---|
| | C 7025 | SUS 304 H-TA | APIKAL NPI |
| Polyimide A | 1250 g/cm | 820 g/cm | 1600 g/cm |
| APIKAL NPI | — | — | — |

As a result, the APIKAL NPI film (tradename, manufactured by Kanegafuchi Chemical Ind. Co., Ltd.) was not adhered to each of the adherends by contact bonding. The reason for this is believed to reside in that, as described above, the APIKAL NPI film was free from thermoplasticity. By contrast, polyimide A had adhesive strength as shown in Table A2, that is, provided good results. This demonstrates the following facts. The thermoplasticity-free resin, when thermally contact bonded, is less likely to develop adhesive power, whereas the polyimide resin using ethylene glycol bis-trimellitic acid dianhydride according to the present invention has a very unique composition which has both properties of etchability and adhesion.

As described above, in a laminate having a laminate structure of first metal layer/insulating layer/second metal layer or a laminate structure of metal layer/insulating layer, when the insulating layer is a laminate of a plurality of layers and at least one of the layers constituting the insulating layer is formed of a polyimide resin which comprises repeating units represented by formula (1) and has a glass transition point of 150 to 360° C. and is dissolvable in a basic solution at a rate of more than 3 µm/min, the laminate according to the present invention has a good shape after etching and, in the case of a continuous laminate, can be continuously etched and, even in wet etching, can be etched with high accuracy. Thus, the productivity of etching is high, the apparatus cost is also advantageously low, and a good etching shape can be realized after etching.

Optimizing the etching rate of an adhesive insulating layer in an insulating layer of a laminate for precision electronic circuit components, such as wireless suspensions, and, in addition, rendering the adhesion of the adhesive insulating layer good means simultaneous realization of both contradictory property requirements. In the prior art technique, it has been difficult to simultaneously realize both contradictory property requirements. On the other hand, according to the present invention, the adoption of a polyimide resin having the above-described specific formulation as an adhesive insulating layer in the polyimide laminate and insulating film can simultaneously realize the above requirements. Therefore, the laminate having the above layer construction can be continuously wet etched, and the laminate for precision electronic circuit components can also be continuously treated. Therefore, when the wet etching is applied, etching can be carried out in an etching time which is at least one order shorter than the etching time necessary in the conventional plasma etching.

When the production of precision electronic circuit components, for example, wireless suspensions, by wet etching is contemplated, as is apparent from the results of the following examples, products free from a change in quality in the metal 20 surface can be obtained.

Example B

Etching Test

Insulating layers were prepared using the following thermoplastic resin varnishes and low expansion polyimide films by the following method. In this case, the following etching liquid was used for etching.

Thermoplastic resin varnish . . . PAA-A (tradename), polyamic acid varnish manufactured by Mitsui Chemicals Inc.; N 8020, AT 8020 (tradename), and BA 5050 (tradename), polyamide imide varnish manufactured by Toyobo Co., Ltd.; and SN-20 (tradename), PN-20 (tradename), and EN-20 (tradename), polyimide varnish manufactured by New Japan Chemical Co., Ltd.

Low expansion polyimide film . . . APIKAL NPI (tradename), polyimide film manufactured by Kanegafuchi Chemical Ind Co., Ltd.; and KAPTON EN (tradename), polyimide film manufactured by Du Pont-Toray Co., Ltd.

Etching liquid . . . TPE-3000 (tradename), alkali-amine polyimide etching liquid manufactured by Tray Engineering Co., Ltd.

The thermoplastic resin varnishes were spin coated onto an SUS 304 plate having a size of 15 cm×15 cm and a thickness of 100 µm to a thickness of 20 to 40 µm. The coated portions of all the varnishes [N 8020 (tradename, polyamide imide varnish manufactured by Toyobo Co., Ltd., AT 8020 (tradename, polyamide imide varnish, manufactured by Toyobo Co., Ltd.), BA 5050 (tradename, polyamide imide varnish, manufactured by Toyobo Co., Ltd.), SN-20 (tradename, polyimide varnish, manufactured by New Japan Chemical Co., Ltd.), and EN-20 (tradename, polyimide varnish, manufactured by New Japan Chemical Co., Ltd.)] except for PAA-A (tradename, polyamic acid varnish manufactured by Mitsui Chemicals Inc.) were dried in an oven at 180° C. for 30 min.

On the other hand, the coated portion of PAA-A (tradename, polyamic acid varnish, manufactured by Mitsui Chemicals Inc.) was dried at 120° C. for 15 min to remove the solvent, and was then subjected to predetermined treatment to conduct thermal imidation, thereby preparing a polyimide.

Each of the dried coated products thus obtained was cut into a size of about 1.5 cm in length× about 2 cm in width, and a cut was provided with a cutter knife at the center of the samples, followed by the measurement of the film thickness as an initial film thickness with a tracer type film thickness meter Dektak 16000 (tradename, manufactured by Sloan Technology).

Thereafter, the samples were dipped in the alkali-amine polyimide etching liquid TPE-3000 (tradename, manufactured by Toray Engineering Co., Ltd.), which had been stirred with a magnetic stirrer regulated at 70° C. to such an extent that a vortex took place, and, for each dipping time, the thickness of the film substantially in its site, where the initial film thickness had been measured, was measured with a tracer type film thickness meter Dektak 16000 (tradename, manufactured by Sloan Technology). The film thickness after dipping was subtracted from the initial film thickness to determine the degree of reduction in film thickness. The results are shown in a graph of FIG. 4 wherein the dipping time (sec) are plotted as abscissa against degree of reduction in film thickness (µm) as ordinate.

The rate of etching (µm/min) at 70° C. of each of the thermoplastic resin varnishes and each of the low expansion polyimide films with the alkali-amine polyimide etching liquid TPE-3000 (tradename, manufactured by Tray Engineering Co., Ltd.) is shown in Table B1 below.

TABLE B1

| Resin layer | Etching rate, pm/min |
|---|---|
| SN-20 | About 11 μm/min |
| PAA-A | About 1 μm/min |
| AT 8020 | About 0.01 μm/min |
| PN-20 | About 5 μm/min |
| N 8020 | About 8.5 μm/min |
| APIKAL NPI | About 20 μm/min |
| EN-20 | About 11 μm/min |
| BA-5050 | About 15 μm/min |
| KAPTON EN | About 7 μm/min |

Evaluation of Adhesion

Three adherends, an 18 μm-thick copper alloy foil C 7025 (tradename, a copper alloy foil, manufactured by Olin Corp.), a 20 μm-thick SUS 304 HTA foil (tradename, SUS foil manufactured by Nippon Steel Corp.), and a 75 μm-thick APIKAL NPI film (tradename, polyimide film, manufactured by Kanegafuchi Chemical Ind. Co., Ltd.), were provided, and the adhesion of the thermoplastic resin and the resin film to the adherends was evaluated as follows.

i) Preparation of Evaluation Sample of Thermoplastic Resin

For AT 8020, a resin layer having an extremely low etching rate as shown in Table B1 above, the evaluation of the adhesion was not carried out. For the other thermoplastic resins shown in Table B1, the adhesion was evaluated as follows.

The surface of a 100 μm-thick SUS 304 HTA plate (substrate) (tradename, an SUS foil, manufactured by Nippon Steel Corp.) was roughened by means of a wet blaster manufactured by Macoho Co., Ltd. with alumina of #1000 as an abrasive material under conditions of pressure 0.7 kg/cm$^2$ and scanning speed 10 min/sec, and the surface was then ultrasonically washed with pure water for 30 min to remove the abrasive deposited on the surface. In this case, both sides of the plate were roughened because roughening of only one side causes warpage of the SUS 304 plate as the substrate. The reason why concaves and convexes were intentionally provided on the surface of the metal plates as the substrate is that, upon the application of tensile force, separation does not take place between the resin layer and the metal plate as the substrate and interfacial peeling between the adherend and the resin layer or cohesive failure of the resin layer necessarily takes place.

The resins shown in Table B1 above were spin coated onto the surface of the metal plate as the substrate, both sides of which had been roughened, to a film thickness of 2 to 3 μm. The coatings were dried in the same manner as used in the etching test, optionally followed by imidation. Thus, resin layers were provided on the substrate. The laminates having a layer construction of resin layer/substrate thus obtained were stacked onto each adherend, that is, a 20 μm-thick SUS 304 HTA foil (tradename, manufactured by Nippon Steel Corp.), an 18 μm-thick copper alloy foil C 7025 (tradename, manufactured by Olin Corp.), and a 75 μm-thick APIKAL NPI film (manufactured by Kanegafuchi Chemical Ind. Co., Ltd.), and vacuum contact bonding was carried out at a temperature, which provided the lowest storage modulus of each of the thermoplastic resins, at a surface pressure of 1 MPa for 10 min to prepare evaluation samples. Here the tan δ peak obtained in the measurement of viscoelasticity was regarded as Tg.

ii) Preparation of Evaluation Samples of Resin Films

APIKAL NPI (tradename, a polyimide film with a thickness of 25 μm, manufactured by Kanegafuchi Chemical Ind. Co., Ltd.) and KAPTON EN (tradename, thickness 25 μM, manufactured by Du Pont-Toray Co., Ltd.) were provided as resin films.

Both sides of the above-described three adherends were roughened in the same manner as described above in i).

The resin films were thermally contact bonded and stacked to each of the adherends under conditions of 300° C. and 1 MPa to prepare evaluation samples respectively having a laminate structure of the following combinations.

APIKAL NPI (thickness 25 μm)-SUS 304 (thickness 20 μm)

APIKAL NPI (thickness 25 μm)-C 7025 (thickness 18 μm)

APIKAL NPI (thickness 25 μm)-APIKAL NPI (thickness 75 μm)

KAPTON EN (thickness 25 μm)-SUS 304 (thickness 20 μm)

KAPTON EN (thickness 25 μm)-C 7025 (thickness 18 μm)

KAPTON EN (thickness 25 μm)-APIKAL NPI (thickness 75 μm)

iii) Evaluation Results

Each of the evaluation samples of i) and ii) was cut into a width of 1 cm with a hand push cutter, followed by a 90-degree peel test with a material tester type 5565 (tradename) manufactured by Instron at a tensile speed of 500 nm/min. The strength of adhesion (g/cm$^2$) of each evaluation sample to the adherends is shown as the evaluation results of adhesion in Table B2 below.

For the resin film in ii), the results of the 90-degree peel test are not shown in Table B2 below because the resin film was not adhered even after the contact bonding operation and thus could not be evaluated for the adhesion.

TABLE B2

| Thermoplastic resin | Adherend | | |
|---|---|---|---|
| | C 7025 | SUS 304 HTA | APIKAL NPI |
| PAA-A | 1250 g/cm | 1300 g/cm | 920 g/cm |
| N 8020 | 190 g/cm | 10 g/cm | 270 g/cm |
| BA 5050 | 520 g/cm | 50 g/cm | 820 g/cm |
| SN-20 | 250 g/cm | 70 g/cm | 200 g/cm |
| PN-20 | 300 g/cm | 200 g/cm | 360 g/cm |
| EN-20 | 1250 g/cm | 820 g/cm | 1600 g/cm |

Evaluation of Shape of Pattern

In order to prepare a core insulating layer, a 12.5 μm-thick APIKAL NPI film (tradename, a polyimide film manufactured by Kanegafuchi Chemical Ind. Co., Ltd.) was cut into a size of 15 cm×15 cm square the periphery of which was then securely applied onto a 100 μm-thick SUS 304 plate with a weakly pressure-sensitive adhesive tape so as not to cause cockling, thereby flattening the surface of the polyimide film. In the same manner as described above in the etching test, EN-20 (tradename, polyimide varnish, manufactured by New Japan Chemical Co., Ltd.) was spin coated as an adhesive layer to a film thickness of 2.5 μm±0.3 μm on a dry basis, and the film was then dried. Thereafter, the coated film was separated from the SUS plate as the support, and the polyimide film was turned over, and the polyimide film was again applied to the SUS plate so as not to cause cockling. In the same manner as described above, a film of EN-20 was formed. The assembly was separated from the support. Thus, film A with an adhesive layer was prepared.

In the same manner as described above, a film of PAA-A was formed on both sides of a 12.5 μm-thick APIKAL NPI film to prepare film B with an adhesive layer, and a film of EN-20 was provided on both sides of a 12.5 μm-thick KAPTON EN film to prepare film C with an adhesive layer. The etching rate ratio of the core insulating layer to the adhesive layer is shown in Table B3 below.

TABLE B3

| | Etching rate | | Thickness of core insulating layer:total thickness of adhesive layer | Ratio of etching rate |
|---|---|---|---|---|
| | Core insulating layer | Adhesive layer | | |
| Film A with adhesive layer | About 20 μm/min | About 11 μm/min | 5:2 | 20:11 |
| Film B with adhesive layer | About 20 μm/min | About 1 μm/min | 5:2 | 20:1 |
| Film C with adhesive layer | About 7 μm/min | About 11 μm/min | 5:2 | 7:11 |

These films each with an adhesive layer were sandwiched between a 20 μm-thick SUS 304 HTA foil manufactured by Nippon Steel Corp. and an 18 μm-thick copper alloy foil C 7025 manufactured by Olin Corp. so that copper foil in its rough surface faced the film, followed by vacuum contact bonding under conditions of pressure 1 MPa and 300° C. for 10 min to prepare three-layer materials having a layer construction of SUS:insulating layer:copper.

In such a state that the SUS side was masked, the three-layer material was dipped in a ferric chloride solution to etch the copper foil. A 5 μm-thick alkali development-type dry film resist was heat laminated onto the exposed adhesive layer surface under conditions of speed 6.5 m/min, roll surface temperature 105° C., and linear pressure 2 to 4 kg/cm, and the laminate was then allowed to stand at room temperature for 15 min. Thereafter, exposure was carried out using a predetermined mask by means of a contact exposure system at 1000 mJ/cm$^2$. The exposed laminate was allowed to stand at room temperature for 15 min, and the dry film resist was then developed with a 1 wt % aqueous $Na_2CO_3$ solution of room temperature under conditions of 30° C. and spray pressure 2 kg for 40 sec. Thereafter, the dry film resist was dried, and was dipped in an etching liquid TPE-3000 (manufactured by Toray Engineering Co., Ltd.) which had been stirred at 70° C. with a magnetic stirrer to such an extent that a vortex took place. When the polyimide film was fully removed in the form of the mask, the dry film resist was taken out of the etching liquid, followed by the separation of the dry film resist with a 3 wt % aqueous NaOH solution of 50° C. at a spray pressure of 1 kg.

Figure 8:
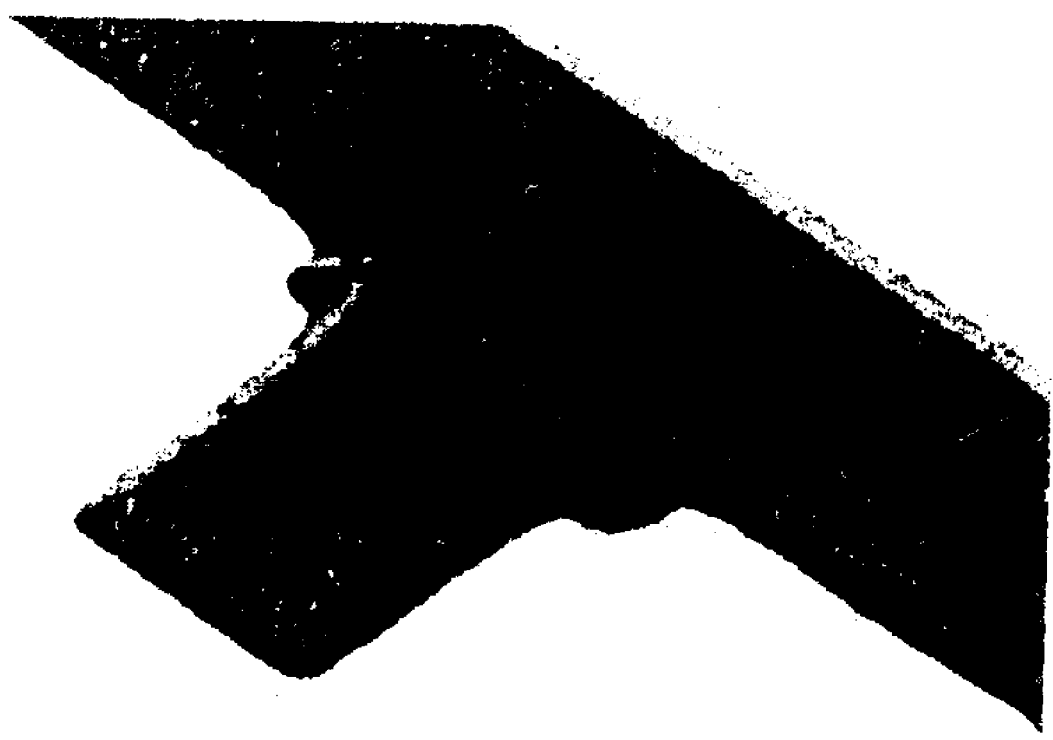
FIG. 8 is an SEM (scanning electron microscope) photograph showing an etching shape of a three-layer material using film C with an adhesive layer.

SEM (scanning electron microscope) photographs obtained by perspectively photographing the etching shape of the insulating layer are shown in FIGS. 5, 6, and 8, wherein FIG. 5 shows the three-layer material using the film A with an adhesive layer, FIG. 6 the three-layer material using the film B with an adhesive layer, and FIG. 8 the three-layer material using the film C with an adhesive layer.

Figure 7:
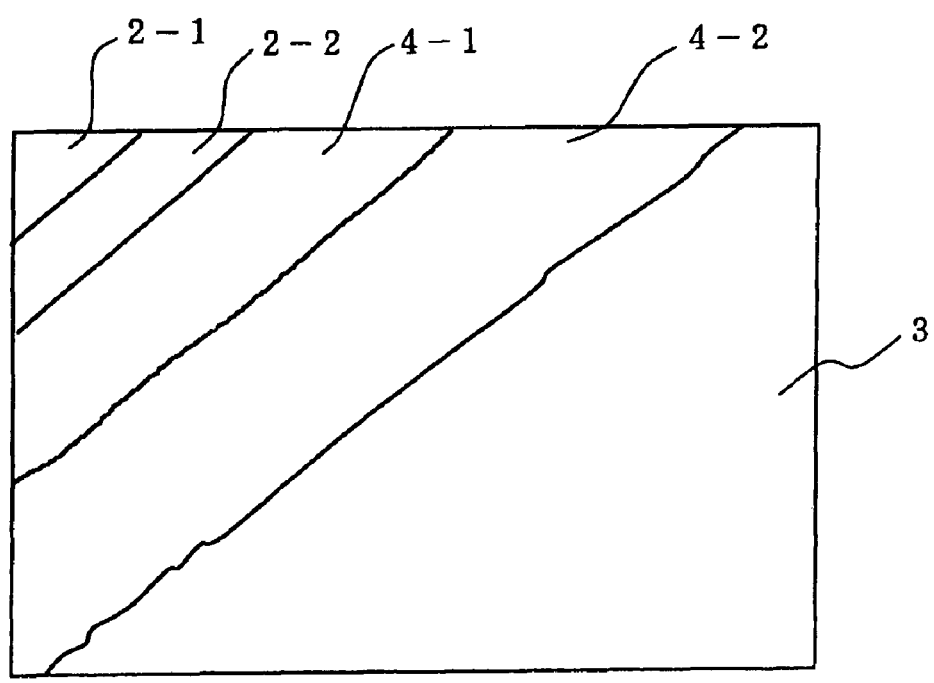
FIG. 7 is a schematic illustration of the photograph shown in FIG. 6.

For the three-layer material using the film A with an adhesive layer shown in FIG. 5 and the three-layer material using the film C with an adhesive layer shown in FIG. 8, the taper angle was about 45 degrees and the cross section was fully straight. On the other hand, for the three-layer material using the film B with an adhesive layer shown in FIG. 6, the adhesive layer remaining unetched was projected in the form of a roof on the core insulating layer. FIG. 7 is a schematic illustration of the photograph shown in FIG. 6.

In FIG. 7, 4-1 represents the upper adhesive layer, and 4-2 the lower adhesive layer. Since both the adhesive layers 4-1, 4-2 are slowly etched by the wet process, the adhesive layers are left in the form of the eaves of the roof. The core insulating layer is etched so as to be bored, and, thus, cannot be viewed at this angle. 2-1 represents the surface of the first metal layer in its portion remaining unetched, and 2-2 a vertical ridge obtained by etching of the first metal layer and shows such a state that the first metal layer has been etched on the adhesive layer 4-1. The second metal layer 3 remains unetched as the SUS foil. The cross section of the whole film B is substantially identical as that shown in FIG. 1.

This demonstrates that, when the laminate comprising a plurality of resin layers, stacked on top of each other, different from each other in etching rate is etched, the ratio of etching rates of the individual layers has a great effect on the shape after etching.

As described above, in a laminate having a laminate structure of first metal layer/insulting layer/second metal layer or a laminate having a laminate structure of metal layer/insulating layer, when the insulating layer comprises a plurality of layers and the ratio of the etching rate of the layer having a higher etching rate to the etching rate of the layer having a lower etching rate is 6:1 to 1:1, preferably 4:1 to 1:1, the laminate according to the present invention has a good shape after etching and, in the case of a continuous laminate, can be continuously etched and, even in wet etching, can be etched with high accuracy. Thus, advantageously, the productivity of etching is high, and the apparatus cost is also low.

Optimizing the etching rate of an insulating layer, constituted by a core insulating layer and an adhesive layer, in a laminate for precision electronic circuit components, such as wireless suspensions, to realize good etching shape and, in addition, rendering the adhesion of the adhesive layer good means simultaneous realization of both contradictory requirements. In the prior art technique, it has been difficult to simultaneously realize both the contradictory requirements. On the other hand, the present invention could have realized simultaneous realization of these properties and thus has made it possible to apply wet etching, which enables continuous treatment, to laminates for precision electronic circuit components. Therefore, when the wet etching is applied, etching can be carried out in an etching time which is at least one order shorter than the etching time necessary in the conventional plasma etching.

When the production of precision electronic circuit components, for example, wireless suspensions, by wet etching is contemplated, as is apparent from the results of the following examples, products free from a change in quality in the metal surface can be obtained.

Example C

Evaluation for Change in Quality of Metal Surface

A change in quality of the metal surface by etching was evaluated for a suspension wherein etching of a polyimide as an insulating layer was carried out with $NF_3$ plasma, a suspension wherein etching of a polyimide as an insulating layer was carried out with an alkali solution, and a stainless steel surface of the laminate before processing as a reference.

FIG. 3 (a) shows the laminate before processing, and FIG. 3 (b) shows the laminate after plasma etching or wet etching with an alkali solution. In FIG. 3, numeral 11 designates stainless steel, numeral 12 an insulating layer, and numeral 13 copper. A site indicated by an arrow A represents the surface of the stainless steel 11 of the laminate before processing, and a site indicated by an arrow B represents the surface of the stainless steel 11 of the laminate after etching.

i) Conditions for Measurement

The surface of the stainless steel 11 was analyzed by XPS (X-ray photoelectron spectroscopy). ESCALAB 220i-XL (tradename, manufactured by VGScientific, GB) was used as an XPS analyzer. X-ray was a monochromatic Al Kα radiation at an output of 200 W (10 kV-20 mA). In this case, for the measurement, the spot diameter was 1 mmϕ, the lens mode was Small AreaXL 150, the opening degree of apertures was F.O.V. (visual field restriction aperture)=3.25, A.A. (objective aperture)=4.25, measuring region=150 μmϕ, and photoelectron ejection angle (ejection angle)=90 degrees. The electrification neutralization is unnecessary and thus was not measured.

ii) Confirmation of Detector System in Silver Plate

Under conditions described in the above item i), the lens mode was brought to Large Area XL, and F.O.V. and A.A. were brought to open (measuring region: 700 μmϕ), and, for a silver standard sample (a 300 μm-thick silver plate having a purity of 99.98%: stock No. AG-403-428, manufactured by The Nilaco Corporation), before the measurement, sputter etching with $Ar^+$ ions was carried out until the disappearance of carbon, followed by the measurement of the surface. In this case, the sensitivity was such that the count of Ag 3d5/2 peak was 2.97 (Mcps) and the position of the peak was 367.95 eV (wide scanning in the range of 0 to 1350 eV at P.E.=100 eV).

iii) Conditions for Obtaining Spectrum

For a site indicated by an arrow B in FIG. 3 (b) of the plasma-etched laminate and the laminate, which had been wet etched with an alkali solution, a wide scan spectrum and a narrow scan spectrum were measured.

For the wide scan spectrum, the range of 0 to 1100 eV was measured at intervals of 1.0 eV (1101 points in total). In this case, P.E. (pass energy) was 50 eV, and the number of scans was a desired one. For the narrow scan spectrum, basically, the range of ±10 eV around the position of the main peak of the element detected in the wide area was measured at intervals of 0.100 eV (201 points in total). In this case, P.E. was 20 eV, and the number of scans was a desired one.

In the analysis of data, the electrification of each spectrum was corrected on the assumption that the peak of the C—C bond of C1s was 284.6 eV. Eclipse Data System Release 2.1 Rev06 (a software manufactured by VG Scientific, GB) was used for measurement, data processing, and analysis. The work function of the apparatus was set to 4.3700.

iv) Found Values of Elementary Analysis

Found values of the elementary analysis under the above conditions are shown in Table C below.

TABLE C

| Sample | Dry | | Wet | |
| --- | --- | --- | --- | --- |
| | After etching | Reference | After etching | Reference |
| C | 47.4 | 34.7 | 42.5 | 37.4 |
| N | 3.1 | 0.0 | 1.4 | 0.0 |
| O | 32.4 | 45.1 | 40.4 | 44.1 |
| F | 1.4 | 0.0 | 0.9 | 0.0 |
| Si | 0.0 | 6.2 | 2.2 | 6.2 |
| S | 0.7 | 0.5 | 0.0 | 0.0 |
| Ca | 0.0 | 1.1 | 0.0 | 1.7 |
| Cr | 5.3 | 1.9 | 3.9 | 2.8 |
| Mn | 0.8 | 1.7 | 1.3 | 2.2 |
| Fe | 6.5 | 8.1 | 7.2 | 5.5 |
| Ni | 1.3 | 0.4 | 0.2 | 0.1 |
| Cu | 1.0 | 0.4 | 0.0 | 0.0 |

Unit = atomic %

These results show that, for both dry etching sample and wet etching sample, the atomic % of the nitrogen and fluorine atoms are increased as compare with the atomic % (zero) in the reference.

v) XPS Chart

Figure 9:
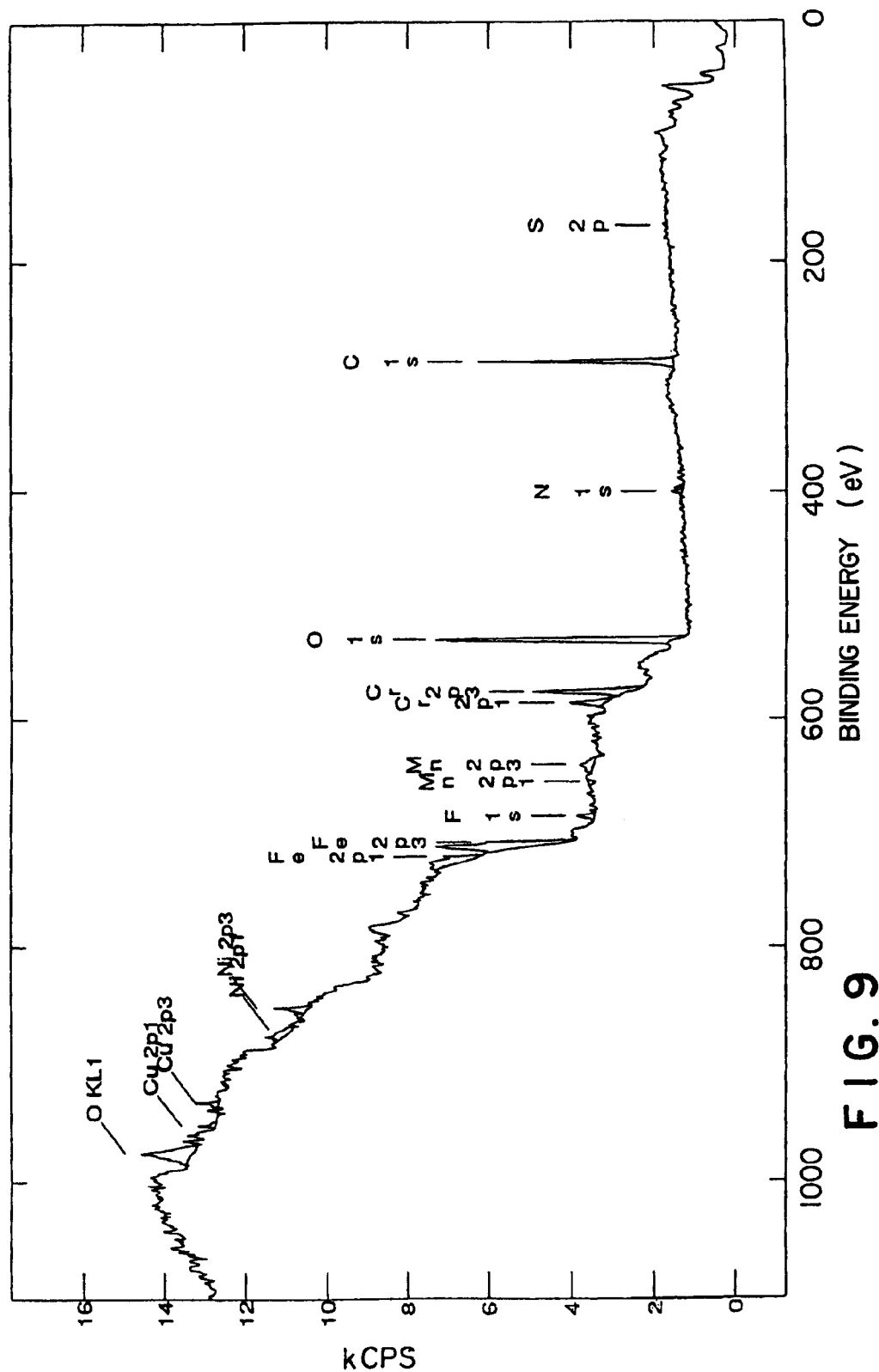
FIG. 9 is an XPS chart of a dry etching sample.
Figure 10:
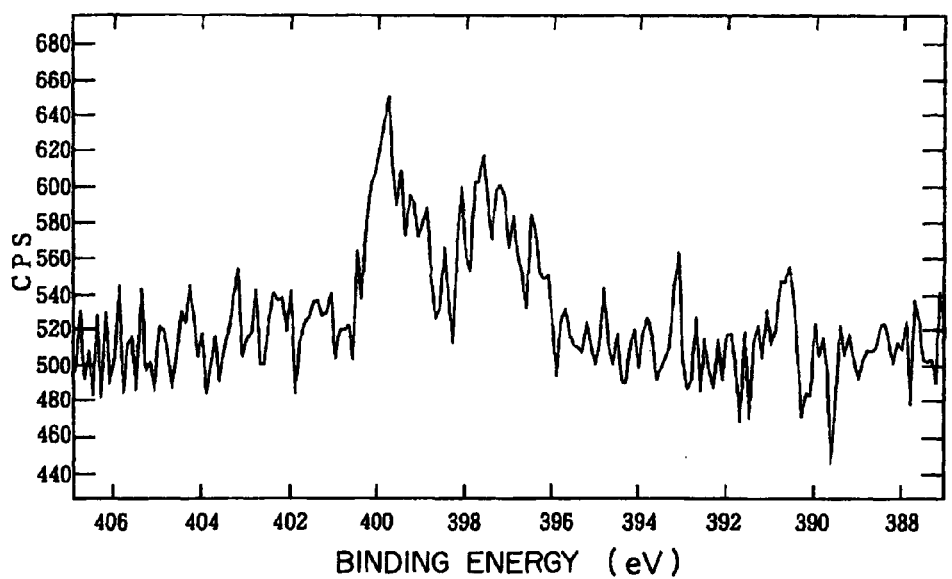
FIG. 10 is an XPS chart showing detailed measured data of portions corresponding to nitrogen and fluorine.
Figure 11:
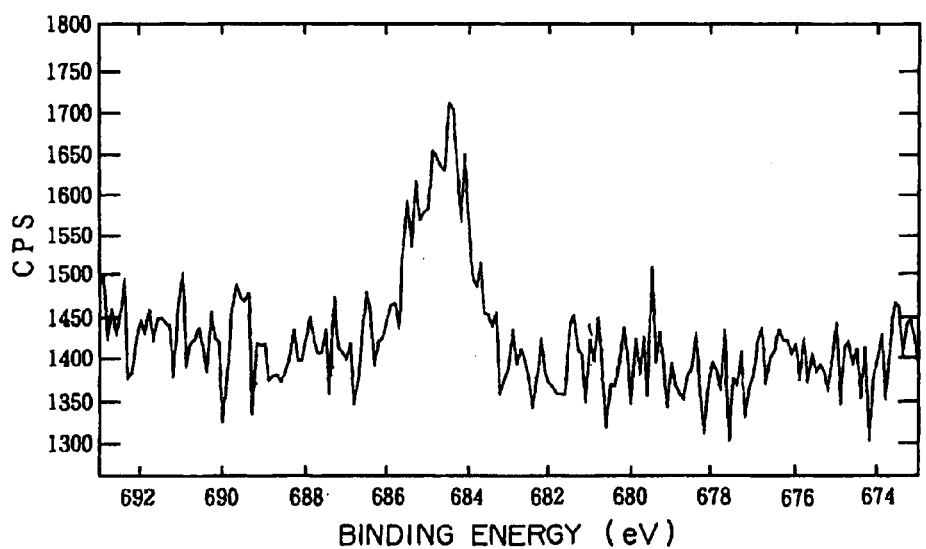
FIG. 11 is an XPS chart showing detailed measured data of portions corresponding to nitrogen and fluorine.
Figure 12:
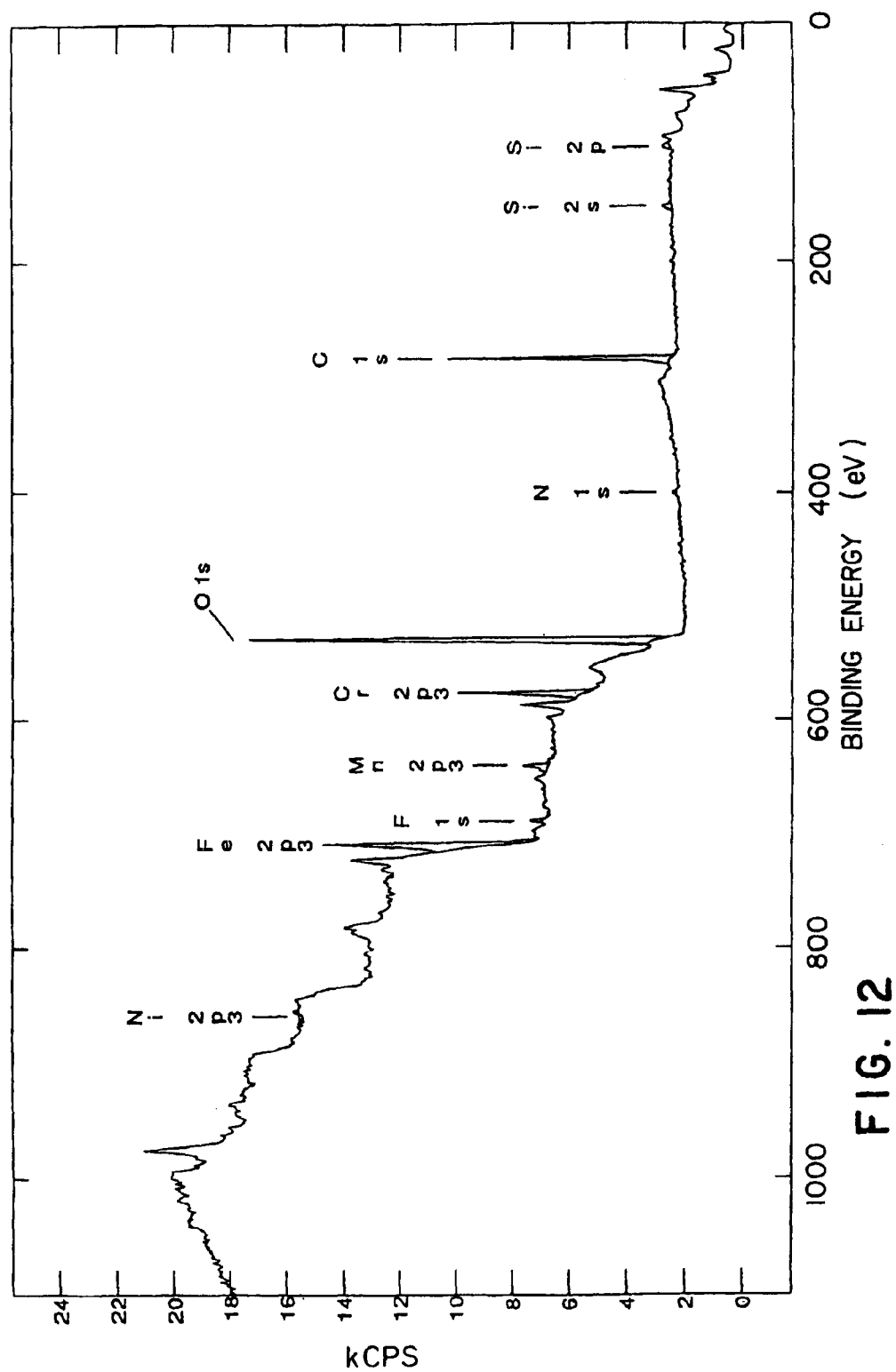
FIG. 12 is an XPS chart showing the results of measurement of a wet etching sample.
Figure 13:
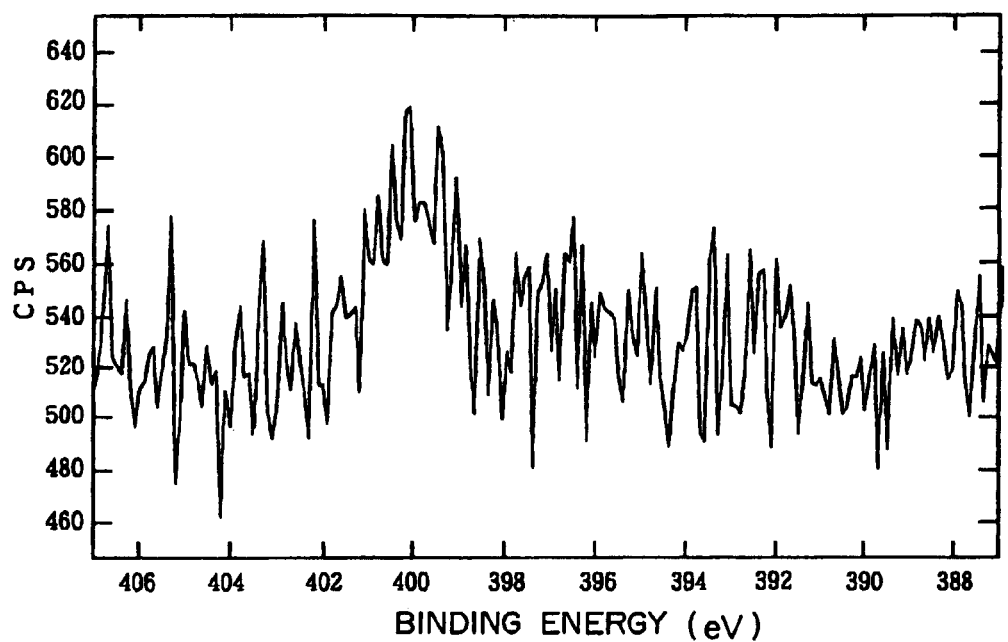
FIG. 13 is an XPS chart showing the results of measurement of a wet etching sample.
Figure 14:
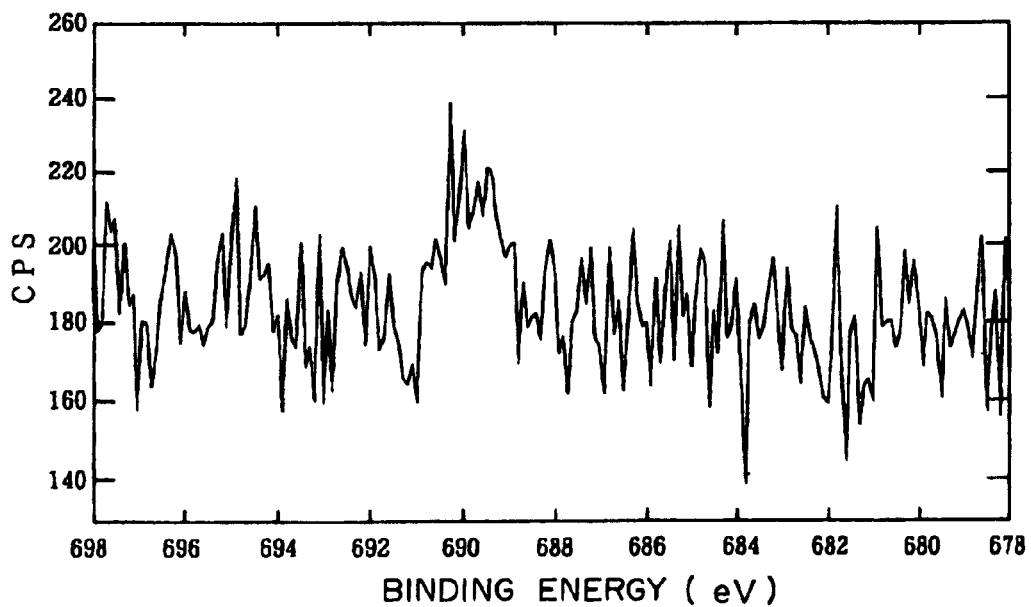
FIG. 14 is an XPS chart showing the results of measurement of a wet etching sample.
Figure 15:
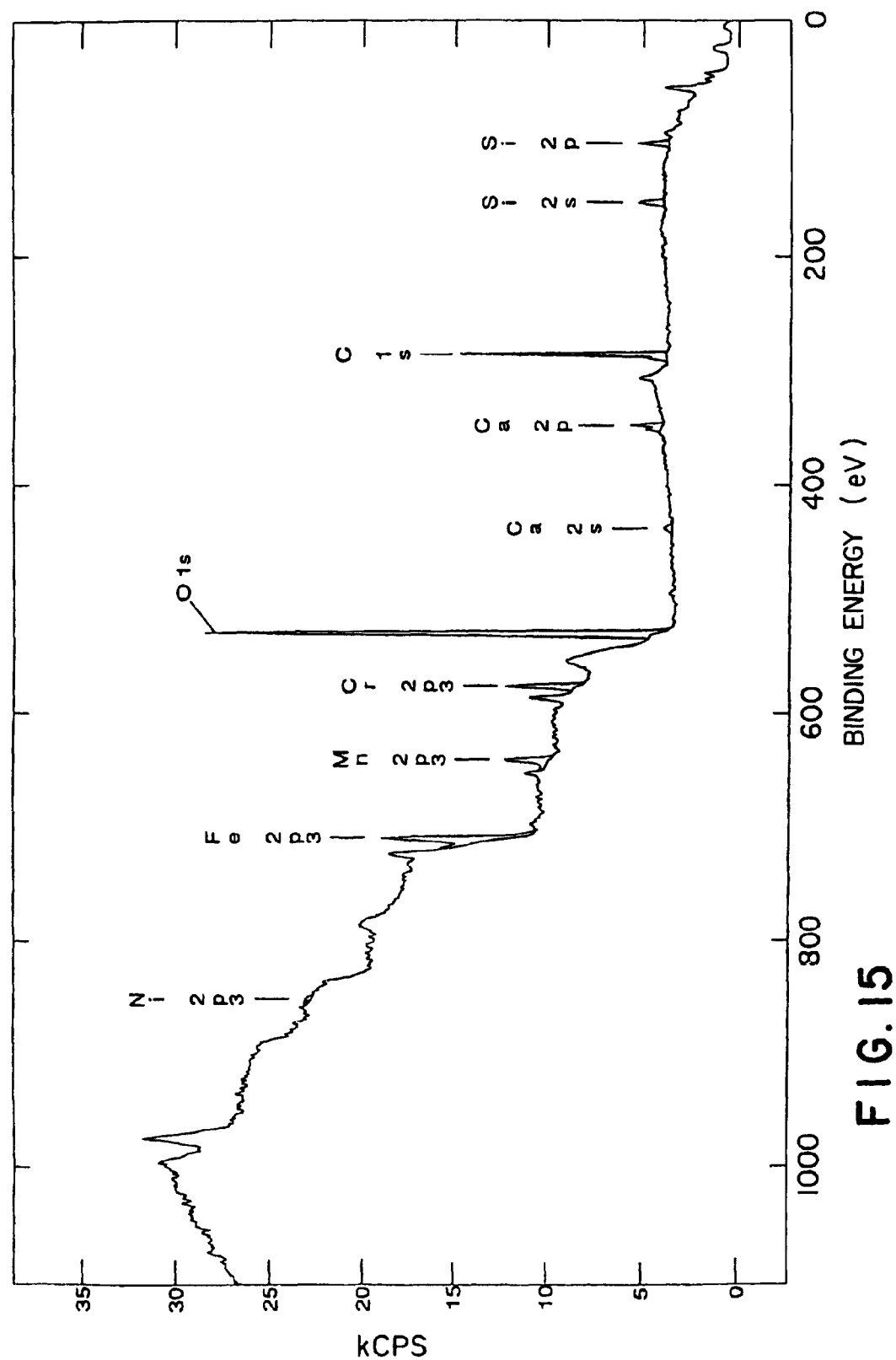
FIG. 15 is an XPS chart of a reference of a plasma etching sample.
Figure 16:
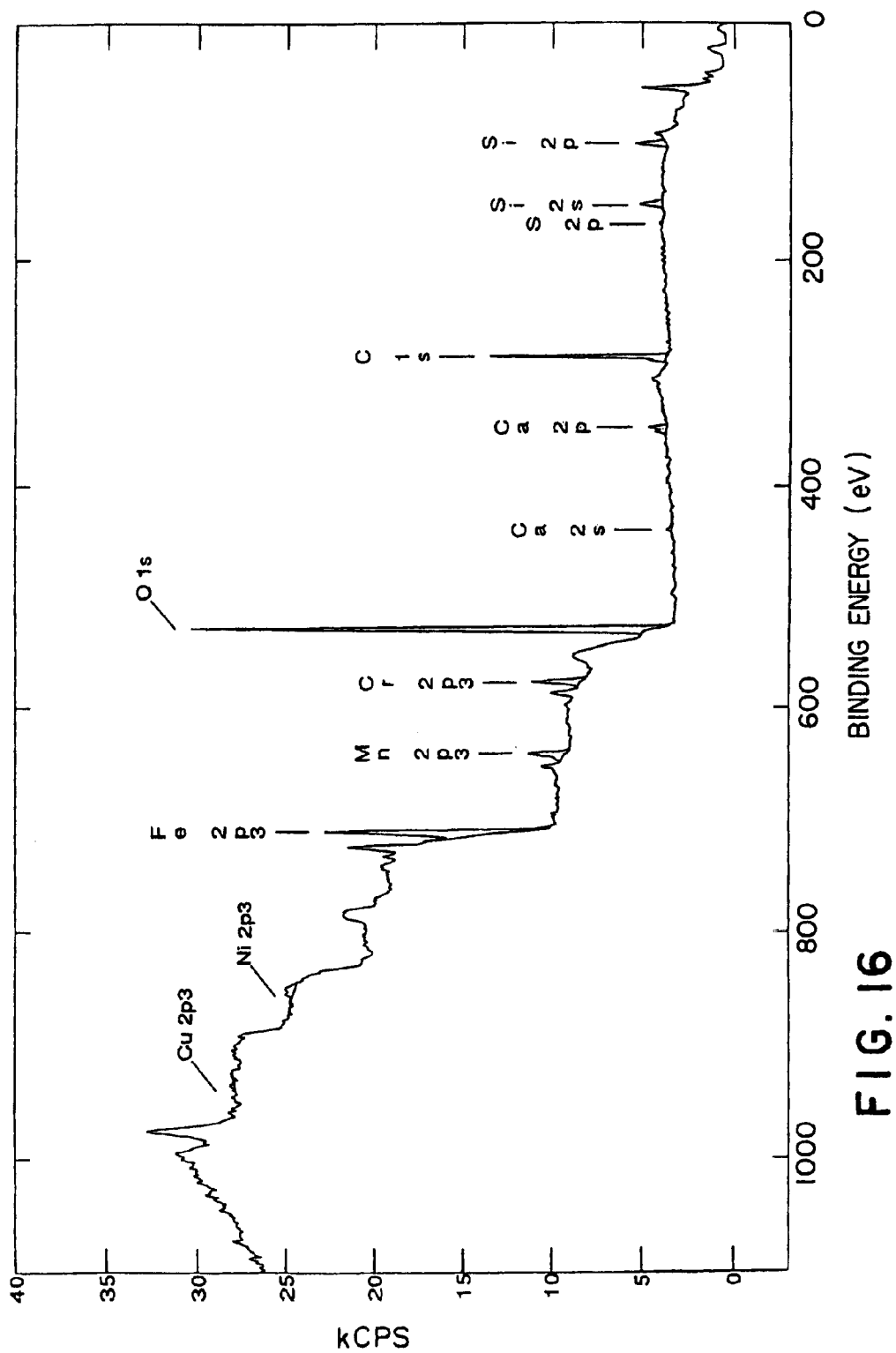
FIG. 16 is an XPS chart of a reference of a wet etching sample.

For the dry etching sample and wet etching sample, the peaks indicating the nitrogen and fluorine components were analyzed from XPS charts. FIG. 9 is an XPS chart of the dry etching sample, and FIGS. 10 and 11 are XPS charts showing detailed measured data of portions corresponding respectively to nitrogen and fluorine. Likewise, the measurement results of the wet etching sample are shown as XPS charts in FIGS. 12, 13, and 14. For XPS charts of the references, an XPS chart for the plasma etching sample is shown in FIG. 15, and an XPS chart for the wet etching sample is shown in FIG. 16.

As is apparent from these charts, for nitrogen, in the case of the dry etching sample, two peaks, a peak derived from organic nitrogen (around 400 eV) and a peak derived from inorganic nitrogen (397 eV), were detected, whereas, in the case of the wet etching sample, only a peak derived from organic nitrogen was detected. Also for fluorine, the same difference as found on the inorganic nitrogen and organic nitrogen was detected between the dry etching sample and the wet etching sample. Specifically, in the case of the wet etching sample, no peak derived from inorganic fluorine was detected although a peak derived from organic fluorine (690 eV) was detected.

The organic nitride and the organic fluoride detected in both the dry etching sample and the wet etching sample are estimated to be a very small amount of the polyimide left after etching and organic matter deposited during the process.

These facts show that patterning of the insulating layer by the plasma etching process results in a specific change in quality of the surface of stainless steel exposed to the plasma.

The invention claimed is:

1. A method for producing a laminate for an electronic circuit component, comprising:
   providing (i) a first layer construction comprising a first inorganic material layer/a first insulating layer/a second inorganic material layer or (ii) a second layer construction comprising the inorganic material layer/the first insulating layer, wherein:
      at least the first insulating layer has a multi-layer structure including at least a first resin layer comprising a core insulating layer and a second resin layer comprising an adhesive layer; the first resin layer has a first etching rate when etched with an alkali-aliphatic amine solution and the second resin layer has a second etching rate when etched with the alkali-aliphatic amine solution; and
      wet-etching the first or second layer construction with an alkali-aliphatic amine solution so that a ratio of the first etching rate to the second etching rate is from 4:1 to 1:1, thereby controlling a shape of an edge of the laminate after etching.

* * * * *